United States Patent
Ye et al.

(10) Patent No.: US 11,721,052 B2
(45) Date of Patent: Aug. 8, 2023

(54) FLOORPLAN IMAGE TILES

(71) Applicant: Nuvolo Technologies Corporation, Paramus, NJ (US)

(72) Inventors: Tao Ye, Cypress, TX (US); Khoa Nguyen Van Ho, Houston, TX (US)

(73) Assignee: NUVOLO TECHNOLOGIES CORPORATION, Paramus, NJ (US)

(*) Notice: Subject to any disclaimer, the term of this patent is extended or adjusted under 35 U.S.C. 154(b) by 412 days.

(21) Appl. No.: 17/031,185

(22) Filed: Sep. 24, 2020

(65) Prior Publication Data
US 2022/0092834 A1    Mar. 24, 2022

(51) Int. Cl.
| G06T 11/60 | (2006.01) |
|---|---|
| G06F 3/04845 | (2022.01) |
| G06T 3/40 | (2006.01) |
| G06T 11/40 | (2006.01) |

(52) U.S. Cl.
CPC .......... *G06T 11/60* (2013.01); *G06F 3/04845* (2013.01); *G06T 3/40* (2013.01); *G06T 11/40* (2013.01); *G06F 2203/04806* (2013.01); *G06T 2200/24* (2013.01)

(58) Field of Classification Search
None
See application file for complete search history.

(56) References Cited

U.S. PATENT DOCUMENTS

| 6,341,291 B1 | 1/2002 | Bentley et al. |
|---|---|---|
| 8,155,943 B2 | 4/2012 | Nasle |
| 8,818,769 B2 | 8/2014 | Trainer et al. |
| 9,454,623 B1 | 9/2016 | Kaptsan |
| 10,121,286 B2 | 11/2018 | Alsaffar et al. |
| 10,445,438 B1 | 10/2019 | Motonaga et al. |
| 2007/0186160 A1 | 8/2007 | McArdle et al. |
| 2007/0226314 A1* | 9/2007 | Eick ............ G06F 16/986 709/217 |

(Continued)

OTHER PUBLICATIONS

Chen et al. (2019) "Floor-SP: Inverse CAD for Floorplans by Sequential Room-Wise Shortest Path", IEEE International Conference on Computer Vision (ICCV), 10 pages.

(Continued)

*Primary Examiner* — Kee M Tung
*Assistant Examiner* — Jed-Justin Imperial
(74) *Attorney, Agent, or Firm* — Mintz Levin Cohn Ferris Glovsky and Popeo, P.C.

(57) ABSTRACT

Methods, systems, and apparatus, including computer programs encoded on computer storage media, for generating a floorplan user interface. One of the methods includes receiving, from a user device, a request for presentation of image content that depicts a floorplan; determining whether one or more criteria for providing image tiles instead of a vector image that depicts the floorplan are satisfied, each of the image tiles having the same tile size, having a file size that is smaller than a vector image file size for the vector image, and depicting a portion of the floorplan; and in response to determining that the one or more criteria for providing image tiles instead of a vector image that depicts the floorplan are satisfied, providing, to the user device, one or more image tiles from the image tiles to cause the user device to present the one or more image tiles on a display.

19 Claims, 5 Drawing Sheets

(56) References Cited

U.S. PATENT DOCUMENTS

| | | | |
|---|---|---|---|
| 2008/0172605 A1 | 7/2008 | Smith | |
| 2010/0169272 A1 | 7/2010 | Labatte et al. | |
| 2014/0344296 A1* | 11/2014 | Chawathe | G06F 16/9537 707/769 |
| 2015/0106325 A1 | 4/2015 | Cole et al. | |
| 2015/0379957 A1* | 12/2015 | Roegelein | G09G 5/005 345/667 |
| 2016/0246899 A1 | 8/2016 | Hirschtick et al. | |
| 2016/0328421 A1 | 11/2016 | Sarratori et al. | |
| 2017/0147717 A1 | 5/2017 | Chen et al. | |
| 2018/0113878 A1 | 4/2018 | Duggal et al. | |
| 2019/0213287 A1 | 7/2019 | Ye et al. | |
| 2020/0285514 A1 | 9/2020 | Ghare et al. | |
| 2020/0351337 A1 | 11/2020 | Calmon et al. | |
| 2021/0073449 A1 | 3/2021 | Segev et al. | |
| 2021/0383037 A1 | 12/2021 | Segev et al. | |
| 2022/0092225 A1 | 3/2022 | Parker et al. | |
| 2022/0171892 A1 | 6/2022 | Ho et al. | |
| 2022/0171893 A1 | 6/2022 | Ye et al. | |
| 2022/0188472 A1 | 6/2022 | Parker | |
| 2022/0206445 A1 | 6/2022 | Reichl et al. | |
| 2022/0206856 A1 | 6/2022 | Parker | |
| 2022/0214999 A1 | 7/2022 | Yadav et al. | |
| 2022/0215604 A1 | 7/2022 | Ho et al. | |

OTHER PUBLICATIONS

Muller et al. (2006) "Procedural Modeling of Buildings", Association for Computing Machinery, Inc., 25(3):614-623.

Zhu et al. (Dec. 19, 2013) "A New Reconstruction Method for 3D Buildings From 2D Vector Floor Plan", HAL Open Science, pp. 1-14(15 pages).

Condie, et al. (2010) "Online Aggregation and Continuous Query Support in Mapreduce SIGMOD'10", pp. 1115-1118.

Ekanayake et al. (2008) "MapReduce for Data Intensive Scientific Analysis", Fourth IEEE International Conference on eScience, 2008, 277-284 Pages.

Github.com, [online] "Deepzoom (php library)", Daniel-KM Library Deepzoom, retrieved on Aug. 17, 2020, retrieved from URL: https://github.com/Daniel-KW/LibraryDeepzoom, 4 pages.

Github.com, [online] "TiledSharp", Marshallward/TiledSharp, retrieved on Aug. 17, 2020, retrieved from URL: https://github.com/marshallward/TiledSharp, 4 pages.

Stackexchange.com, [online] "If Geographic Coordinates are unprojected coordinates, how can GIS soft wares display such unprojected data in a plane?", Geographic Information Systems, retrieved on Jun. 2, 2020, retrieved from URL: https://gis.stackexchange.com/questions/146321/if-geographic-coordinates-are-unprojected-coordinates-how-can-gis-softwares-dis#:-:text, 2 pages.

Wikipedia, "Map projection", retrieved from URL: https://en.wikipedia.org/w/index.php?title=Map_projection&oldid=955953903, 2020, 16 pages.

Wikipedia, "Spatial reference system", retrieved from URL: https://en.wikipedia.org/w/index.php?title=Spatial_reference_system&oldid=956142752, 2020, 4 pages.

Wikipedia, "Tiled web map", retrieved from URL: https://en.wikipedia.org/w/index,php?title=Tiled_web_map&oldid=956139437, 2020, 3 pages.

* cited by examiner

FLOORPLAN IMAGE TILES

BACKGROUND

This application relates to computing processes for converting electronic files.

Drawing Exchange Format ("DXF") files are generated by an example computer-aided design ("CAD") program (e.g., commercial CAD programs or drafting software applications) and encode data representations of real-world constructs. For example, the data representations can be two dimensional floorplans for a building, where the floorplans include different outlines for each room of a floor. Data representations of real-world constructs in separate DXF files can be encoded and arranged differently based on preferences and design choices used in the CAD program. Because data representations can be encoded in DXF files in a variety of ways, interpreting DXF files can be challenging.

SUMMARY

A system can generate image tiles for presentation of a floorplan using a vector image, e.g., a scalable vector graphics ("SVG") file. The system can receive the vector image of the floorplan from a map generation system that created the vector image using individual graphical objects, e.g., for components of chairs, tables, televisions, and other objects depicted in the floorplan. In some examples, the vector image includes a large number, e.g., thousands or millions, of graphical objects. The system can optimize the vector image, e.g., by removing metadata and other data that is not depicted in the image portion of the vector image.

The system generates, for each of multiple zoom levels and using the optimized SVG file, one or more image tiles that each depict some of the content for the floorplan. For example, for a maximum zoom-in level, the system can determine a grid of image tiles such that each image tile depicts a corresponding portion of the floorplan. The system can repeat this process until the system generates only a single image tile for a zoom level, e.g., for a maximum zoom-out level. The system can then store the image tiles in memory, provide the image tiles to a device for presentation, or both.

The system can determine whether to provide data for presentation of a vector image or image tiles for a floorplan. For instance, while the vector image has a larger file size, and may take longer to load, the system may have access to a vector image prior to having access to image tiles for the floorplan. This can occur when the system, or another system, generates image tiles from a vector image. The system would then have access to only the vector image while the image tiles are being generated.

The system can determine whether to present a vector image or image tiles using one or more criteria. The one or more criteria can include whether the image tiles are generated, whether image tile presentation is enabled, properties of a device that will be used to present the floorplan, or a combination of two or more of these. For instance, the system can determine whether the image tiles are generated, or a threshold quantity of images tiles are generated. The threshold quantity can be an overall quantity of image tiles, a quantity of image tiles for an area of the floorplan that has been requested for presentation, a quantity of image tiles for a zoom level of a floorplan that has been requested for presentation, or a combination of these.

The system can determine whether image tile presentation is enabled. A property can indicate whether image tile presentation is enabled. The property can be specific to the floorplan. For instance, when a file size of a vector image does not satisfy a threshold file size, e.g., is less than or equal to or either the threshold file size, the system can set a value of the property to indicate that image tile presentation is not enabled. When the file size of the vector image satisfies the threshold file size, e.g., is greater than or equal to or either the threshold file size, the system can set the value of the property to indicate that image tile presentation is enabled. In some examples, image tile presentation can be enabled based on user input, resources available to the system for generation of the image tiles, or both.

In some implementations, the system can detect properties of one or more devices that will be used to present the floorplan, e.g., in a user interface. The devices can be any appropriate type of devices, such as a laptop computer, a desktop computer, a tablet, or a smart phone, e.g., in combination with an integrated display, an external display, or both. The system can determine whether the properties satisfy one or more threshold property values. When the properties satisfy one or more threshold property values, the system can determine to generate the image tiles. This can enable the device to present the floorplan using the image tiles when the device might not be able to present the floorplan using a vector image, or when presentation of the floorplan using the vector image would likely take more than a threshold period of time. For example, a device with properties that satisfy the one or more threshold property values can present image tiles in which fewer objects are tracked and loaded on a screen at a time, compared to a vector image, but for which manipulation of the floorplan might require a call to a server to fetch additional image tiles. The manipulation can be a pan operation, a zoom operation, or both.

When the properties do not satisfy the one or more threshold property values, the system can provide the vector image to the device. For instance, the system can provide a vector image to a device with higher processor, random access memory, or both, properties compared to another device with lower properties to which the system would provide image tiles. This can enable a device whose properties do not satisfy the threshold property values to load the vector image with all objects loaded with fewer calls to the server, e.g., resulting in reduced network traffic compared to a device that receives image tiles.

In general, one aspect of the subject matter described in this specification can be embodied in methods that include the actions of receiving a vector image file that depicts a floorplan; for each of multiple zoom levels for the floorplan: generating, using the vector image file, two or more image tiles that each have the same tile size, have a file size that is smaller than a vector image file size for the vector image file, and depict a portion of the floorplan; and providing, to a device, an image tile from the two or more image tiles for presentation on a display.

In general, one aspect of the subject matter described in this specification can be embodied in methods that include the actions of receiving, from a user device, a request for presentation of image content that depicts a floorplan; determining whether one or more criteria for providing image tiles instead of a vector image that depicts the floorplan are satisfied, each of the image tiles having the same tile size, having a file size that is smaller than a vector image file size for the vector image, and depicting a portion of the floorplan; and in response to determining that the one or more criteria for providing image tiles instead of a vector image that depicts the floorplan are satisfied, providing, to the user device, one or more image tiles from the image tiles to cause the user device to present the one or more image tiles on a display.

Other embodiments of this aspect include corresponding computer systems, apparatus, computer program products, and computer programs recorded on one or more computer storage devices, each configured to perform the actions of the methods. A system of one or more computers can be configured to perform particular operations or actions by virtue of having software, firmware, hardware, or a combination of them installed on the system that in operation causes or cause the system to perform the actions. One or more computer programs can be configured to perform particular operations or actions by virtue of including instructions that, when executed by data processing apparatus, cause the apparatus to perform the actions.

The foregoing and other embodiments can each optionally include one or more of the following features, alone or in combination. The method can include determining whether the vector image file size satisfies a threshold size, wherein generating the two or more image tiles is responsive to determining that the vector image file size satisfies the threshold size. The method can include determining a predetermined tile size for each of the two or more image tiles. Generating the two or more images tiles can include generating, using the vector image file, the two or more image tiles that each have the predetermined tile size, have the file size that is smaller than the vector image file size for the vector image file, and depict a portion of the floorplan.

In some implementations, the method can include determining, using a vector image size for a vector image depicted in the vector image file, a quantity of the multiple zoom levels for the floorplan. Generating the two or more image tiles can include, for each of the quantity of the multiple zoom levels for the floorplan: generating, using the vector image file, two or more image tiles that each have the same tile size, have the file size that is smaller than the vector image file size for the vector image file, and depict a portion of the floorplan. The method can include determining vector image dimensions for a zoom level from the multiple zoom levels; and determining a quantity of image tiles that together will depict the floorplan at the zoom level using the vector image dimensions. Generating the two or more image tiles can include generating, for the zoom level from the multiple zoom levels, the quantity of image tiles that (i) together will depict the floorplan at the zoom level and (ii) each have the same tile size, have the file size that is smaller than the vector image file size for the vector image file, and that depict a portion of the floorplan.

In some implementations, the method can include generating an optimized graphics file by removing metadata from the vector image file, the optimized graphics file having a file size that is smaller than the vector image file size. Generating the two or more image tiles can include generating, using the optimized graphics file, the two or more image tiles that each have the same tile size, have the file size that is smaller than the optimized graphics file size for the vector image file, and depict a portion of the floorplan. Generating the two or more image tiles can include generating, using the vector image file, the two or more image tiles that each have one or more first coordinates that indicate a location of the respective image tile within the floorplan, and a second coordinate that represents the zoom level from the multiple zoom levels of the content depicted in the respective image tile.

In some implementations, the method can include storing, in memory, the two or more image tiles for the floorplan; and receiving, from the device, a request for presentation of the floorplan in a user interface on the display. Providing the image tile for presentation on the display can include, in response to receiving the request for presentation of the floorplan in the user interface: determining a portion of the floorplan to depict in the user interface; retrieving, from memory, multiple image tiles including the image tile that together depict the portion of the floorplan; and providing, to the device, (i) the multiple image tiles and (ii) instructions to cause presentation of the multiple images tiles in the user interface on the display.

In some implementations, the method can include receiving, from another user device, another request for presentation of image content that depicts the floorplan; determining, for the other request, whether the one or more criteria for providing image tiles instead of a vector image that depicts the floorplan are satisfied; and in response to determining that at least one of the one or more criteria are not satisfied, providing, to the other user device, the vector image that depicts the floorplan. Determining whether the one or more criteria for providing image tiles instead of a vector image that depicts the floorplan are satisfied can include determining whether multiple image tiles are available for presentation of the floorplan or to provide the vector image that depicts the floorplan. Providing, to the other user device, the vector image that depicts the floorplan can be responsive to determining that multiple image tiles are not available for presentation of the floorplan and to provide the vector image that depicts the floorplan. Receiving the other request for presentation of image content that depicts the floorplan can include after providing the one or more image tiles to the user device, receiving data that indicates a visual update to the floorplan; and in response to receiving the data that indicates the visual update to the floorplan, generating an updated vector image that depicts an updated floorplan including the visual update to the floorplan. Providing the vector image that depicts the floorplan can include providing the updated vector image that depicts the updated floorplan. The method can include generating, from the updated vector image and after receiving the data that indicates the visual update to the floorplan, multiple second image tiles.

In some implementations, the user device and other user device can be the same device. Providing the vector image can occur prior to receiving the request. The method can include providing, to the user device, interactive layer data to cause the user device to present, in a user interface concurrently with presentation of the one or more image tiles or the vector image, an interactive layer that detects user interaction with the user interface; and receiving, from the interactive layer presented at the user device, data that indicates user interaction with the user interface, the user interaction being at least one of a zoom action, a pan action, or an object selection action. The method can include in response to receiving the data that indicates the user interaction with the user interface, determining whether the user interaction indicates a request for a change in the content depicted in the user interface; in response to determining that the user interaction indicates a request for a change in the content depicted in the user interface, determining one or more other image tiles from the image tiles to send to the user device based on the user interaction; and providing, to the user device, the one or more other image tiles to cause the user device to present the one or more other image tiles on the display.

In some implementations, receiving the request can include receiving data that indicates a refresh of a user interface that presents the vector image that depicts the floorplan. Receiving the request can include receiving data that indicates a request for a change in a zoom level for the floorplan. Determining whether the one or more criteria for providing image tiles instead of a vector image that depicts the floorplan are satisfied can include determining whether multiple image tiles are available for presentation of the floorplan or to provide the vector image that depicts the floorplan. Determining whether multiple image tiles are available for presentation of the floorplan can include determining whether a system has finished rendering the multiple image tiles using the vector image. Receiving the request for presentation of image content that depicts the floorplan can include receiving the request for presentation of image content that depicts a particular zoom level for the floorplan. Determining whether a system has finished rendering the multiple image tiles using the vector image can include determining whether a system has finished rendering the multiple image tiles for the particular zoom level for the floorplan.

In some implementations, determining whether multiple image tiles are available for presentation of the floorplan can include determining whether tiling is enabled for the floorplan. The method can include storing, in memory, first data that indicates that tiling is not enabled for the floorplan; receiving, from the user device, second data that indicates a refresh of a user interface that presents the vector image that depicts the floorplan; and determining, using the first data that indicates that tiling is not enabled for the floorplan, to skip a search for image tiles for the floorplan. The method can include storing, in memory, first data that indicates that tiling is not enabled for the floorplan; receiving, from the user device, second data that indicates a refresh of a user interface that presents the vector image that depicts the floorplan; and determining, using the first data that indicates that tiling is not enabled for the floorplan, to skip generation of image tiles for the floorplan.

In some implementations, determining whether the one or more criteria for providing image tiles instead of a vector image that depicts the floorplan are satisfied can include determining one or more properties of the user device; and determining whether the one or more properties of the user device satisfy one or more threshold property values. Providing, to the user device, the one or more image tiles from the image tiles to cause the user device to present the one or more image tiles on a display can be responsive to determining that the one or more properties of the user device satisfy the one or more threshold property values. The vector image can be a scalable vector graphics file.

The subject matter described in this specification can be implemented in various embodiments and may result in one or more of the following advantages. In some implementations, presentation of the image tiles, instead of a larger vector file, e.g., a scalable vector graphics file, can reduce image rendering time, reduce device resource usage when presenting a floorplan, e.g., memory resources, or both. For instance, a system that provides image tiles instead of a vector image can reduce a load time for presentation of image content, e.g., the load time can be a couple of seconds rather than the minutes required to load a vector image. In some implementations, presentation of image tiles can enable presentation of a floorplan on a device, e.g., a smart phone, with limited resources that would be unable to present the floorplan using a larger image file, e.g., a vector image file. In some implementations, the systems and methods described in this document can generate image tiles that have a smaller size, individually, in combination, or both, than a file size of a vector image file from which the image tiles were generated, e.g., a scalable vector graphics file.

In some implementations, presentation of vector images while image tiles are not available can enable a system to provide image content for a floorplan for presentation without having to wait for the image tiles to be available. In some implementations, a system that can provide image tiles for presentation can reduce a load time for presentation of a floorplan, presentation of part of a floorplan, e.g., when the system detects a pan or zoom event for the floorplan, or both. In some implementations, a system that provides image tiles for presentation of a floorplan can reduce bandwidth requirements, e.g., to send image content to a user device, reduce computer resources used to present content, e.g., requires less memory to store and render the image tiles, or both. In some implementations, a system that uses both a vector image and image tiles can present content while image tiles are being generated while later having the benefits of image tiles, e.g., shorter load time.

The details of one or more implementations of the subject matter described in this specification are set forth in the accompanying drawings and the description below. Other features, aspects, and advantages of the subject matter will become apparent from the description, the drawings, and the claims.

BRIEF DESCRIPTION OF THE DRAWINGS

Like reference numbers and designations in the various drawings indicate like elements.

DETAILED DESCRIPTION

Figure 1:
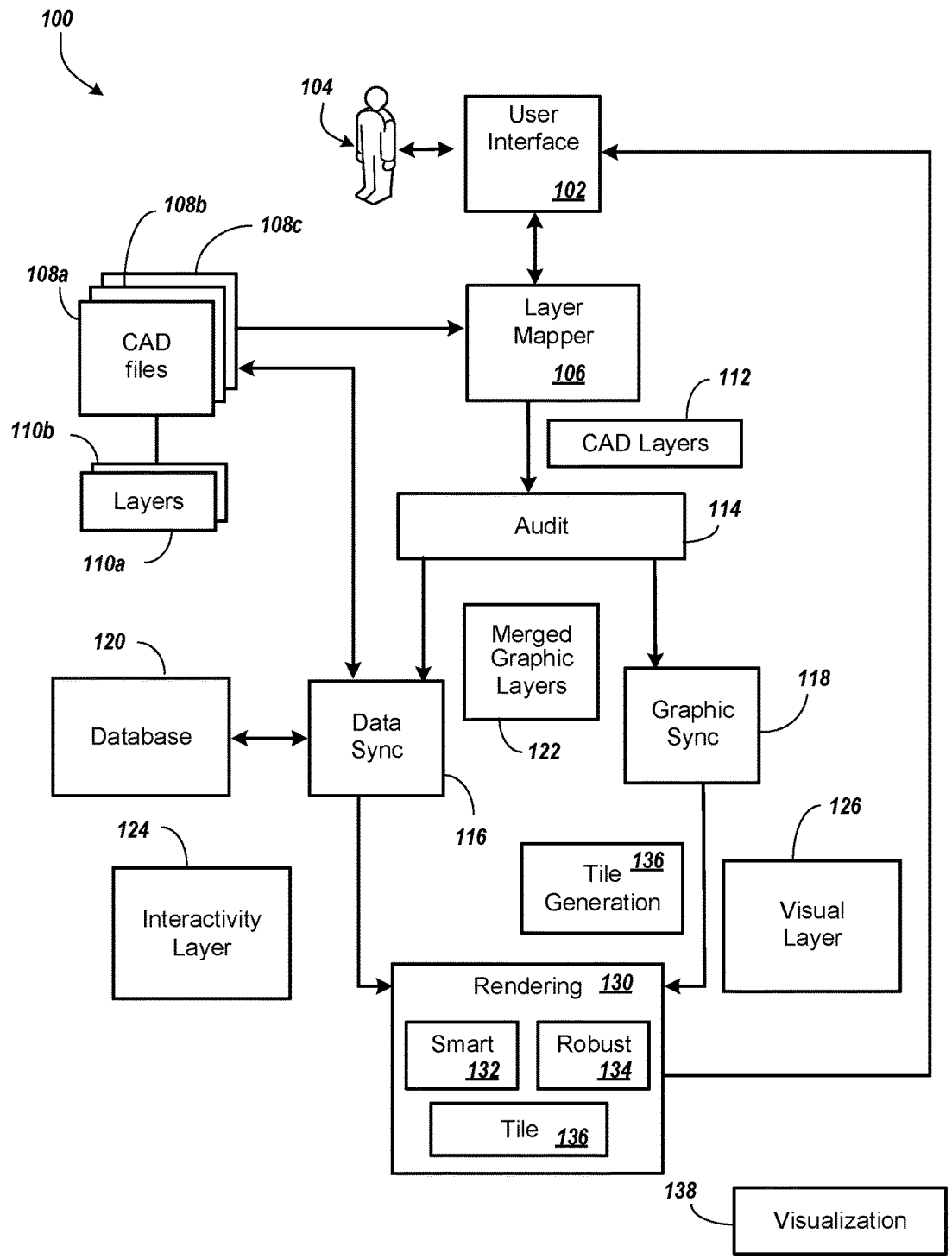
FIG. 1 illustrates an example computing system configured to process one or more drawing files that each include multiple layers.

FIG. 1 illustrates an example computing system 100 ("system 100") configured to process one or more drawing files that each include multiple layers. Each layer of a respective drawing file can correspond to an item of a geographic entity, such as a building or physical location. For example, each of the multiple layers can correspond to a respective item such as a floorplan of a floor in the building, a room of a floor in the building that is represented by the floorplan, or an interior or exterior wall of a room included in the floorplan. Additional details about individual layers and corresponding items that may be associated with a given layer are described in more detail below.

In some implementations, the system 100 is configured to implement a framework for interpreting and extracting graphics and data elements of an example drawing file to digitally render the items of a building for presentation to the user 104. The graphics and data elements cooperate to present a digital representation of the items in an application program used to generate the drawing file. For example, the drawing file can be a DXF file generated by an example computer-aided design ("CAD") program and encode data representations of real-world items, such as the example items described above. Example drafting/design programs may include various commercial CAD tools or related drafting software applications.

Data representations of real-world items in separate or distinct drawing files, or even across distinct layers of a drawing file, can be encoded and arranged differently based on design preferences and drafting protocols used in the CAD program. Because these data representations are often encoded in a variety of ways, extracting specific types of information from a drawing file can be challenging. To address these challenges, the system 100 includes a set of modules that are each configured to execute a subset of the techniques for implementation of the framework used to extract graphics and data elements of a drawing file or present at least some of the extracted graphics, data elements, or both.

The system 100 generally includes a user interface 102 that receives input from a user 104. The user interface 102 can be a graphical interface rendered for display at an example computing device of the system 100. Although not depicted in the example of FIG. 1, the computing device can be any known device operable to display a graphical interface, such as a desktop computer with a display monitor, a laptop computer, a tablet device, a smartphone, a networked client/mobile device, or other related devices. The computing device is operable to exchange data communications with other devices (e.g., client and server devices) of the system 100.

The system 100 includes a layer mapper 106 configured to receive drawing files 108a, 108b, 108c ("drawing files 108"). Each drawing file 108a, 108b, 108c includes one or more layers indicated generally as layers 110a, 110b. In some implementations, the layer mapper 106 obtains the drawings files 108 based on input from user 104 that is received by way of user interface 102. The layer mapper 106 can receive or obtain the drawing files 108 independent of input from user 104 but execute its file audit and data processing operations based on user input received by way of user interface 102.

In some implementations, the layer mapper 106 automatically imports the drawing files 108 from a file storage location and automatically executes its layer mapping and data processing operations. The file storage location may be internal or external to the system 100. For example, the file storage location may correspond to a database 120 (described in more detail below) that includes database tables for storing information about space hierarchies of a geographic location. The space hierarchies may define a physical layout of a region, campus, site, or floor of the geographic location.

The layer mapper 106 is configured to receive or obtain, as inputs, each of the drawing files 108 and generate a layer mapping file based on processes performed on the received inputs. The processes may be executed by the layer mapper 106 based on a mapping template, user input from user 104, or both. In some implementations, the layer mapper 106 generates a layer mapping file based on instructions or commands specified by a space/system administrator ("space admin") that indicate operations to be performed on the drawing files 108. The instructions can define or indicate layers of the drawing files 108 as well as computer-aided facility management ("CAFM") layers stored among database tables of the system 100.

The layer mapper 106 can select a mapping template that defines protocols for aggregating sets of data values of the different layers with respect to instructions and database values of CAFM layers as indicated by a space admin. For example, the layer mapper 106 can receive layer data for multiple layers of a drawing file 108b, where the layer data specifies information for items such as hallways, offices on a floor, types of furniture in the offices, locations of security cameras on the floor, or capabilities of various Wi-Fi hotspots on the floor. The layer mapper 106 can use the template protocols to aggregate values for types of office furniture for a particular office while, for example, filtering out data values that indicate locations of security cameras on a floor.

More specifically, for one or more drawing files 108, the layer mapper 106 can map portions of the layer data for different layers, such as furniture in the offices, to a hierarchy of CAFM layers (e.g., indicating each office on a floor) as defined in the database to produce a grouping of CAD layers 112. For example, the grouping of CAD layers 112 can represent a group of offices on the 9th floor of a building along with each item of furniture in each office of the group. In some implementations, the layer mapper 106 determines the mapping between the drawing layers and the CAFM layers at least by processing data values of the different drawing layers (e.g., received inputs) against the protocols defined by the mapping template and with reference to any grouping preferences indicated by the user 104 or the space admin.

The layer mapper 106 generates a layer mapping output represented by CAD layers 112 based on the mapping between layers of the drawing files 108 and CAFM layers in a database table of the system 100. In some implementations, the layer mapper 106 generates a layer mapping output that aggregates information such as data values and entity records of the received inputs based on the determined mapping of the layers. The layer mapper 106 can generate a layer mapping output that groups layer types such as the offices, the Wi-Fi hotspots, and the types of office furniture for visual rendering to an end-user, e.g., user 104 or a different user.

An audit module 114 receives or obtains, as inputs, each of the CAD layers 112 or an output of the layer mapper 106, and generates an audit output file based on processes performed on the received inputs. For example, the audit module 114 is configured to process data corresponding to each of the CAD layers 112 to identify one or more deficiencies and generate an audit output file based on the identified deficiencies. The audit module 114 can scan each of the CAD layers 112 to detect or identify individual deficiencies that will disrupt or adversely impact a file (or layer) importation process executed by the system 100. For example, the audit module 114 can read entity records that store data values for a layer to detect deficiencies such as unclosed polylines, missing space codes, missing space names, or invalid space types. In some implementations, the audit module 114 detects deficiencies of a drawing file in response to processing data types of a layer or entity record of the drawing file against a predefined list of deficiency codes.

The audit module 114 can be configured to generate recommendations for addressing detected deficiencies of a drawing file. For example, the audit module 114 can generate a signal for a detected deficiency in response to determining that a data type for a space name linked to a layer, e.g., among CAD layers 112, is missing a value for the space code. The audit module 114 can determine that the layer corresponds to a room of a floorplan and generate a recommendation for updating the value of the space code to, for example, "room" or "office." In some implementations, the audit module 114 generates an instruction or command to automatically input a value for the missing space code.

In general, the audit module 114 is configured to standardize layer data of a drawing file for processing by one or more other modules or devices of the system 100. In the example of FIG. 1, the audit module 114 generates an audit output file from one or more groupings of CAD layers 112 based on processes performed on each of the CAD layers 112. The audit module 114 can provide the audit output file to two distinct modules included in the system 100 that perform respective sets of operations for syncing data and graphics for each CAD layer 112 processed by the audit module 114.

The system 100 includes a data sync module 116 and a graphics sync module 118. As described above, the system 100 interprets and extracts graphics and data elements of an example drawing file at least to digitally render certain real-world items of a building for visualization to an end-user. The data sync module 116 is configured to extract the data elements of the example drawing file, whereas the graphics sync module 118 is configured to extract the graphic elements of the drawing file. Each of the data sync module 116 and the graphics sync module 118 executes its respective extraction and syncing operations based on inputs that correspond to the audit output file generated by the audit module 114 and the data associated with the one or more drawing files 108.

In general, the data sync module 116 executes an example workflow for extracting data values of layers identified in the mapping output and for generating data structures used to stage or preview information linked to groupings of layers in the mapping output. Relatedly, the graphics sync module 118 executes an example workflow for reading and exporting graphical (or spatial) elements of layer data for each of the layers in a grouping specified by the mapping output. In some implementations, to export this graphical data of the layers, the graphics sync module 118 calculates dimensional bounds that are used to generate: i) an interactive layer 124 represented by a GeoJSON file and ii) a visual layer 126 represented by a scale vector graphics (SVG) file.

The respective outputs of the data sync module 116 and graphics sync module 118 may be stored in a database 120 and later accessed to generate a preview of the data and graphics for a layer or floorplan before final visual rendering. Additionally, using outputs of the graphics sync module 118, the system 100 can generate a merged graphics layer 122 by overlaying dimensional coordinates of a GeoJSON file over dimensional coordinates of a scale vector graphics ("SVG") file or one or more images tiles generated from the SVG file. The SVG file can be any appropriate type of vector image and need not be an SVG file. The merged graphics layer can be used for presentation of the preview of the data and graphics for the layer or floorplan, presentation of a final version of the layer or floorplan, or both. In some implementations, the system 100 generates the merged graphics layer 122 based on intelligent analytics and calculations related to spatial coordinates and bounds for respective coordinate systems of the SVG file and GeoJSON file or the one or more image tiles and the GeoJSON file. This is described in more detail below.

To improve presentation of the merged graphics layer 122, a tile generation module 128 can generate multiple image tiles from an SVG file. The image tiles can have smaller file sizes, smaller dimensions, or both, than the SVG file. As a result, the system 100 or a device that receives the image tiles from the system 100 can require fewer resources for presentation the image tiles on the user interface 102 than if the SVG file was used for presentation of the merged graphics layer 122. For instance, when each image tile has a smaller file size, each image tile requires less memory than the memory required to store the SVG file. Further, the system 100 can send an image tile to the computing device more quickly than an SVG file because of the smaller file size.

In some implementations, the computing device that presents the user interface 102 can render the image tile more efficiently than the SVG file because of the smaller file size. When multiple image tiles depict the data for a single SVG file, the computing device can use multi-threading support, whether virtual or actual, to more quickly present the image tiles on the user interface 102 than presentation of the SVG file on the user interface 102. The computing device can use a first thread for presentation of a first image tile and a second thread for presentation of a second image tile.

The tile generation module 128 can decouple image tile generation from the graphic sync process by offloading image tile generation to a separate background process. For example, the graphics sync module 118 can extract graphic elements from a drawing file to generate an SVG file. After generation of the SVG file, the tile generation module 128 can generate the image tiles from the SVG file. Because image tile generation can take longer than the graphic element extraction process, the graphics sync module 118 can generate only an SVG file which generation process can be faster than the image tile generation. This can enable the system 100 to present the merged graphics layer 122, e.g., in the user interface 102, using an SVG file rather than image tiles more quickly than if the system 100 waited until the image tile generation process completed. Once the tile generation module 128 finishes generation of some of the image tiles, the system 100 can then use the image tiles for the merged graphics layer 122, taking advantage of the smaller file sizes of the image tiles.

The system 100 includes a rendering module 130 that leverages tile generation technology to visually (or graphically) render data and graphics for layers specified by the layer mapping output. In the example of the FIG. 1, the rendering module 130 is coupled for communication with user interface 102 to provide output parameters (e.g., data and graphics elements) for graphically rendering information for a layer as a display output at the user interface 102.

The rendering module 130 includes logic for a smart renderer 132 as well as for a robust renderer 134. The smart renderer 132 is configured to intelligently switch between non-tile SVG files and image tiles to improve presentation of the merged graphic layers 122 in the user interface 102. In some implementations, the smart renderer 132 enables the rendering module 130 to perform its rendering functions using fewer processor cycles, less memory resources, or both, when dynamic tiling functions of the smart renderer 132 are invoked at the rendering module 130. In some implementations, the smart renderer 132 can enable presentation of the merged graphics layer 122 more quickly using an SVG file than if the merged graphics layer 122 were only presented using image tiles. Hence, the smart renderer 132 can provide improved efficiency relative to other approaches for rendering graphical data at a display.

The robust renderer 134 is configured to overlay data or dimensional coordinates of the GeoJSON file on top of the data or dimensional coordinates of the SVG file, e.g., for the merged graphics layer 122. This overlay feature of the robust renderer 134 is related to the merged graphics layer 122 and intelligent analytics functions described earlier. More specifically, the robust renderer 134 can be used to execute the intelligent analytics and calculations related to spatial coordinates and bounds for respective coordinate systems of the SVG file and GeoJSON file. The robust renderer 134 allows for cooperation between, and integration of, different coordinate systems to allow for improved visualization (138) of data and graphical elements of drawing layers, e.g., when data for the merged graphics layer 122 is presented on the user interface 102.

When the merged graphics layer 122 includes an interactive GeoJSON layer and multiple image tiles, a tile renderer 136 can coordinate presentation of the GeoJSON layer with the image tiles. For instance, the tile renderer 136 can obtain x-y coordinates in computer-aided design ("CAD") screen space, e.g., for the user interface 102. The tile renderer 136 can use these coordinate to align the GeoJSON layer with the image tiles. For instance, the tile renderer 136 can convert coordinates for the GeoJSON layer into coordinates for the image tiles.

Figure 2:
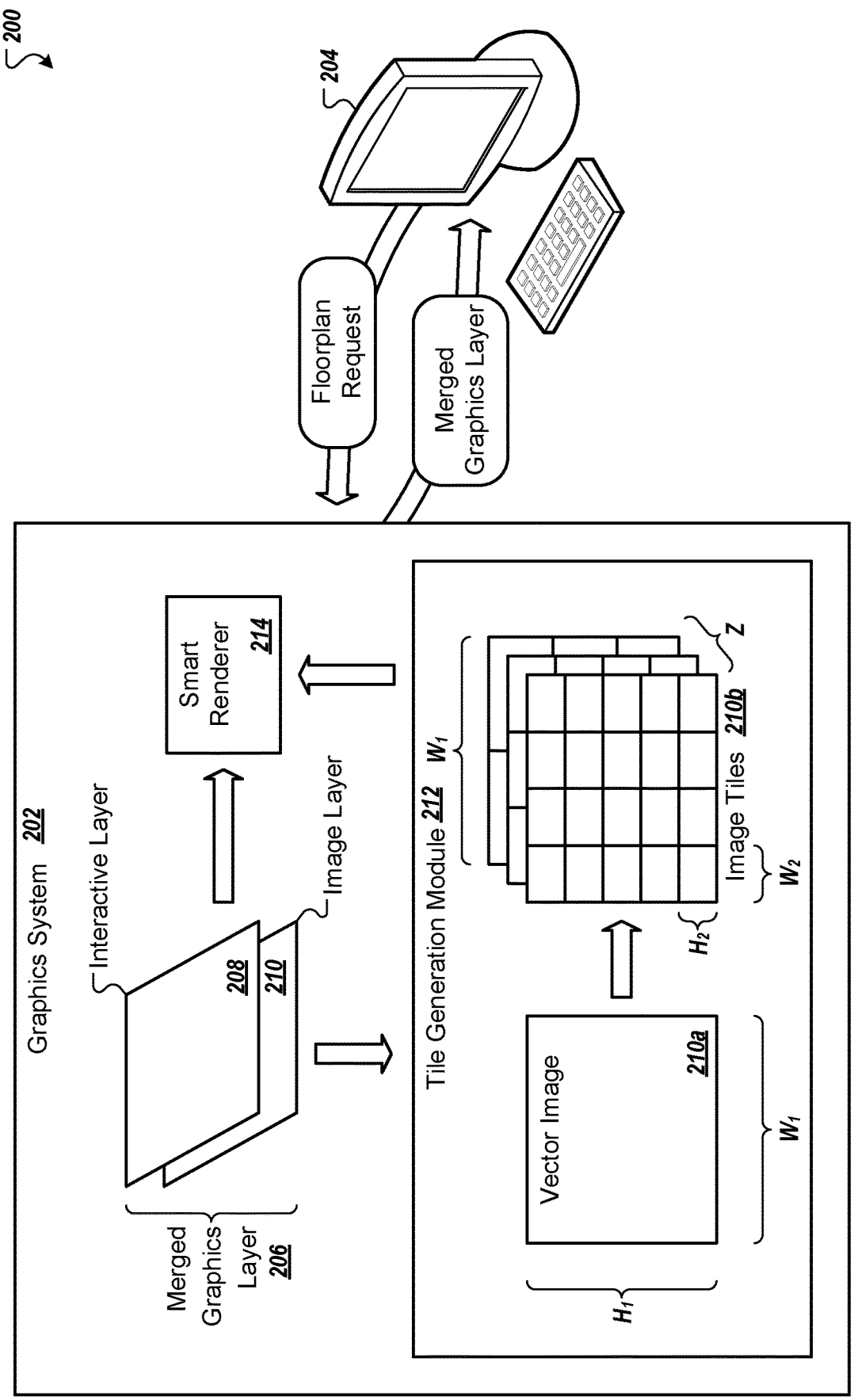
FIG. 2 depicts an example environment in which a graphics system selectively sends image tiles to a user device.

FIG. 2 depicts an example environment 200 in which a graphics system 202 selectively sends image tiles to a user device 204. The graphics system 202 can generate the image tiles, determine whether to send one or more image tiles to the user device 204 in response to a floorplan request, or both.

The graphics system 202 can be a part of the system 100. For instance, the graphics system 202 can include a merged graphics layer 206, e.g., one of the merged graphics layers 122, a tile generation module 212, e.g., the tile renderer 136, a smart renderer 214, e.g., the smart renderer 132, or a combination of two or more of these.

The graphics system 202 can receive the merged graphics layer 206, e.g., that was generated by a graphics sync module. The merged graphics layer 206 includes an interactive layer 208 and an image layer 210. The interactive layer 208 enables user interaction with a floorplan represented by the merged graphics layer 206 when the floorplan is presented in a user interface. The floorplan can be presented in any appropriate user interface, such as a web browser user interface, a native application user interface, or both, depending on the application that requests data for the merged graphics layer 206. When data for the merged graphics layer 206 is presented in a user interface on a display, e.g., for the user device 204, the interactive layer 208 detects user interaction with the merged graphics layer 206.

A system, e.g., the system 100 or the graphics system 202, can determine an action to perform based on the detected user interaction. For example, when the detected user interaction is a pan or a zoom operation, the graphics system 202 can determine whether to send additional image content to the user device 204, what portion of the floorplan should be depicted in the user interface, or both. The graphics system 202 can then send the appropriate data for the merged graphics layer 206 to the user device based on the detected user interaction.

The image layer 210 can be a vector image 210a, or multiple image tiles 210b. For instance, depending on presentation criteria, the graphics system 202 can send a merged graphics layer 206 with a vector image 210a to the user device 204 or the graphics system 202 can send a merged graphics layer 206 with one or more image tiles 210b to the user device 204. These presentation criteria are discussed below in more detail.

When the graphics system 202 provides the user device 204 with a merged graphics layer 206 that includes the vector image 210a, the graphics system 202 can provide the user device 204 with all data for presentation of the floorplan in a user interface. That is, receipt of the merged graphics layer 206 with the vector image 210a can reduce network communications between the user device 204 and the graphics system 202 because the vector image 210a includes all image content for the floorplan. The merged graphics layer 206 that includes a vector image 210a can reduce an amount of time necessary for presentation of portions of the floorplan after the interactive layer 208 detects a zoom or a pan user interaction because the user device 204 does not need to request additional image data from the system.

When the graphics system 202 provides the user device 204 with a merged graphics layer 206 that includes multiple images tiles 210b, the graphics system 202 can provide the user device 204 with only some of the data for presentation of a floorplan in a user interface. Receipt of the merged graphics layer 206 that includes an image tile 210b can reduce network latency, presentation latency, or both, because the image tile 210b has a smaller file size than the vector image 210a. The graphics system 202 can provide the user device 204 with image tiles 210b as needed, e.g., when the interactive layer 208 detects a pan or a zoom user interaction, the system can provide the user device 204 with additional image tiles 210b. In some examples, the graphics system 202 can provide image tiles 210b to the user device 204 such that the user device 204 will store the image tiles 210b in a cache, e.g., for later retrieval as needed.

The graphics system 202 can determine whether to generate image tiles 210b for a merged graphics layer 206. The graphics system 202 can include one or more tile generation criteria, e.g., that are stored in a memory. When one or more of the tile generation criteria are satisfied, the graphics system 202 can determine to generate image tiles 210b for a merged graphics layer.

For instance, the graphics system 202 can determine whether a size a vector image 210a for a merged graphics layer satisfies a threshold size, e.g., as a tile generation criteria. The threshold size can be a file size, a resolution size, or a combination of both. The size of the vector image 210a can satisfy the threshold file size when the vector image 210a size is greater than, equal to, or either, the threshold file size. The threshold size can be a graphics system 202 parameter, e.g., specified based on user input.

In some implementations, the graphics system 202 can determine whether one or more parameters for the merged graphics layer 206 indicate that the graphics system 202 should generate image tiles 210b from the vector image 210a. For instance, the graphics system 202 can receive multiple different merged graphics layers 206. Some of the different merged graphics layers 206 can be for different entities, e.g., can be floorplans of different buildings, floorplans for different companies, or both. A merged graphics layer 206, or an entity, can have a property that indicates whether the graphics system 202 should generate image tiles 210b from a vector image 210a for the floorplan or for all floorplans for the entity.

When the property indicates that the graphics system 202 should not generate image tiles 210b and the graphics system 202 accesses a merged graphics layer 206, e.g., in memory or received from another component, the graphics system 202 determines to skip generating image tiles 210b for the merged graphics layer 206. The graphics system can then store, or maintain, a merged graphics layer 206 with a vector image 210a as the image layer 210 in memory, send such a merged graphics layer 206 to the user device upon receipt of a floorplan request from a user device 204, or both.

When the property indicates that the graphics system 202 should generate image tiles 210b and the graphics system 202 accesses a merged graphics layer 206, the graphics system 202 provides an instruction to the tile generation module 212 that causes the tile generation module 212 to generate the image tiles 210b from the vector image 210a. This can occur after the graphics system 202 generates the vector image 210a, e.g., in response to generation of the vector image 210a, or at another appropriate time.

The tile generation module 212 can generate the image tiles 210b using the vector image 210a. Each of the image tiles 210b has a smaller file size than the vector image 210a. For instance, when the vector image 210a has a file size of 40 MB, each of the image tiles 210b can have a file size of approximately 4 MB.

In some examples, some of the image tiles can have a different file size, resolution size, or both, than other image tiles. For instance, the tile generation module 212 can generate image tiles 210b for one or more edges of the image content that have a size than the other image tiles. The image tiles with the different file size, resolution size, or both, can be the image tiles on the bottom edge of the image content, the right edge of the image content, the top edge of the image content, the left edge of the image content, or a combination of two or more of these. For example, the tile generation module can generate image tiles for the bottom and right edges that have different sizes.

The tile generation module 212 can select the resolution for each of the image tiles 210b. The resolution can be a predefined resolution. The predefined resolution can be the same for all image tiles generated for all merged graphics layers 206, or for all image tiles generated for a particular entity. For instance, the tile generation module 212 can select a resolution of 1024 pixels by 1024 pixels.

The tile generation module 212 generates a first zoom layer of image tiles 210b using the resolution. For instance, the tile generation module 212 can determine a pixel size for the vector image 210a. The pixel size can have a first height $H_1$ and a first width $W_1$.

The tile generation module 212 can divide the vector image 210a into portions using the resolution and the pixel size for the vector image 210a such that each portion will correspond to an image tile. The pixel size for the vector image 210a can be a width and a height for the vector image 210a, e.g., specified by style data for the vector image 210a. For example, the tile generation module 212 can determine "ideal" height and width values for the vector image 210a from a rect tag for the vector image 210a and use the idea values for the pixel size for the vector image 210a.

The tile generation module 212 can generate the image tiles 210b for the first zoom layer such that each of the image tiles 210b depicts a corresponding one of the portions of the content from the vector image 210a. One or more of the image tiles 210b has a second height $H_2$ and a second width $W_2$ that are smaller than respective dimensions of the pixel size for the vector image 210a, e.g., the first height $H_1$ and the first width $W_1$.

When the vector image 210a has a pixel size of 7680 pixels by 4320 pixels, the tile generation module 212 can generate forty image tiles 210b for the first zoom layer, e.g., for a grid that has a width of eight image tiles by a height of five image tiles. In this example, the image tiles 210b form a grid that is 8192 pixels by 5120 pixels, e.g., and larger than the pixel size for the vector image 210a. To account for the differences in resolution, the tile generation module 212 can create one or more image tiles 210b that have a height and a width that are less than the second height H2 and the second width W2. For instance, the tile generation module 212 can generate a row of image tiles 210b for the image content on the bottom of the vector image 210a that have a height of 224 pixels. The tile generation module 212 can generate a column of image tiles 210b for the image content on the right of the vector image 210a that have a width of 512 pixels.

The tile generation model 212 can determine a number of zoom levels for the vector image 210a by generating tiles for the vector image 210a based on the pixel size for the vector image 210a. The tile generation module 212 can then generate one or more image tiles 210b for a second zoom layer. The tile generation module 212 determines an updated pixel size for the second zoom level for the vector image 210a by dividing the pixel size, e.g., the height and the width, by a value to determine the pixel dimensions for the next zoom level for the vector image 210a. For instance, the tile generation module 212 can divide the height and the width by two to determine an updated pixel size for the vector image 210a for the second zoom layer. The tile generation module 212 can then generate image tiles 210b for the vector image 210a using the updated pixel size. The tile generation module 212 can repeat this process until the tile generation module 212 generates a single tile that represents the content depicted in the vector image 210a.

The tile generation module 212 repeats this process for multiple zoom layers Z until the tile generation module 212 determines that a threshold criteria has been satisfied. For instance, the tile generation module 212 repeats this process until the tile generation module 212 generates a single image tile for the most zoomed out layer. In some examples, when a tile size is within a threshold distance of a threshold tile size for which a single image tile depicts all of the content in the vector image 210a, the tile generation module 212 can determine to generate the single image tile that depicts all of the content in the vector image 210a and to stop generating other image tiles for additional zoom layers Z.

In some implementations, each of the images tiles 210b can have multiple coordinates that identify the image tile 210b. For instance, a first coordinate, e.g., a z coordinate, can indicate a zoom layer to which the image tile 210b belongs. A second coordinate, e.g., an x coordinate, and a third coordinate, e.g., a y coordinate, can indicate a location for the image tile in the zoom layer. For instance, the second and third coordinates can indicate where a predetermined location of the image tile 210b, e.g., the top left corner of the image tile, is with respect to the other image tiles 210b in the zoom layer. This location can be, for instance, at (0,0), (0,1024), or (1024,1024) to name a few examples.

When determining image content to present in a user interface, a device or system can use the coordinates to select one or more image tiles. For instance, the graphics system 202, e.g., the interactive layer 208, can determine a zoom level out of multiple zoom levels, e.g., a first zoom level, for the z coordinate. The graphics system 202 can determine an area of the floorplan that will be depicted in the user interface. The graphics system 202 determines this area using the x-y coordinates for the screen. This can include the x-y coordinates for the top-left corner of the screen, the bottom-right corner of the screen, both, or some other combination of one or more coordinates. The graphics system 202 can determine, using the x-y coordinates for the image tiles, which image tiles for the determined zoom level have x-y coordinates that overlap with the x-y coordinates of the area that will be presented in the user interface. The graphics system 202 can then provide the determined image tiles to the user device 204 for presentation.

Some of the image tiles 210b depict sub-portion of the floorplan while the vector image 210a depicts the entire floorplan. For example, a most zoomed out image tile 210b can depict the entire floorplan while having a smaller file size than the vector image 210a. The image tiles 210b other than the most zoomed out image tile 210b can each depict only a portion of the floorplan. For instance, for a zoom level that includes four image tiles, a first image tile can depict the top left portion of the floorplan, a second image tile can depict the top right portion of the floorplan, a third image tile can depict the bottom left portion of the floorplan, and a fourth image tile can depict the bottom right portion of the floorplan. In this way, all of the image tiles 210b have a smaller file size than the vector image 210a, and depict at least a portion of the content from the vector image 210a, while all of the image tiles 210b for a particular zoom layer depict all of the content from the vector image 210a, e.g., though potentially at a different level of detail.

In some implementations, the tile generation module 212 can determine the resolution for the image tiles 210b using a pixel size of the vector image 210a. For instance, the tile generation module 212 can balance the number of image tiles that would be generated for a vector image 210a with the size of the individual tiles. As a result, the tile generation module 212 can adjust the image tile 210b resolution to adjust a total number of image tiles 210b necessary for a vector image 210a, an amount of memory in which the image tiles 210b can be stored, or both.

In some implementations, the tile generation module 212 can optimize the vector image 210a before generating the image tiles 210b. For instance, the tile generation module 212 can remove metadata or other data from the vector image 210a that isn't presented as part of the floorplan, e.g., that isn't necessary for presentation of the floorplan. This can reduce a size of the vector image 210a, sizes of the image tiles 210b generated from the vector image 210a, or both.

The tile generation module 212 can store the vector image 210a, the image tiles 210b, or both, in memory. The tile generation module 212 can store data that identifies the merged graphics layer 206 to which the vector image 210a, the image tiles 210b, or both, belong. The data can be an identifier for the merged graphics layer 206 or other appropriate data.

In some examples, after generating the image tiles 210b for a merged graphics layer 206, the graphics system 202 discards the vector image 210a from which the image tiles 210b were generated. For instance, the graphics system 202 can delete, from memory, a vector image 210a 210b in response to completing generation of the multiple image tiles 210b using the vector image 210a.

Given the content for a floorplan, and depicted by the vector image 210a, image tile 210b generation by the tile generation module 212 might not happen instantly. As a result, the system might receive a floorplan request for the merged graphics layer 206 from a user device 204 before the image tile 210b generation process completes. This can occur when a floorplan, or a vector image 210a, has millions of lines that represent objects in the floorplan, millions of graphics objects, or both. The objects can be any appropriate types of objects for a floorplan, such a tables, chairs, rooms, and the like.

When the graphics system 202 receives a floorplan request from a user device 204, the smart renderer 214 determines whether one or more presentation criteria for presenting image tiles 210b are satisfied. When the smart renderer 214 determines that none of the presentation criteria are satisfied, the graphics system 202 provides the user device 204 with a merged graphics layer 206 that includes a vector image 210a along with the interactive layer 208.

For instance, the smart renderer 214 determines an identifier for the floorplan requested by the user device 204. The smart renderer 214 determines a merged graphics layer 206 for the floorplan using the floorplan identifier. This can include the smart renderer 214 determining the interactive layer 208 and the vector image 210a for the merged graphics layer 206 using the floorplan identifier.

When the smart renderer 214 determines that some or all of the presentation criteria are satisfied, the graphics system 202 provides the user device 204 with the merged graphics layer 206 that includes the interactive layer 208 and one or more of the image tiles 210b for the merged graphics layer 206. The graphics system 202 might not provide the user device 204 with all of the image tiles 210b for the merged graphics layer 206 at the same time but rather can provides the user device 204 with a proper subset of the image tiles 210b for the merged graphics layer 206. For example, the smart renderer 214 or another component in the graphics system 202 can determine a portion of the floorplan that should initially be presented on a user interface for the user device 204. The smart renderer 214 then determines the image tiles 210b that depict the content included in the portion of the floorplan. The graphics system 202 then provides, to the user device 204, the determined image tiles 210b that depict the content included in the portion of the floorplan. The portion of the floorplan can be the entire floorplan, e.g., for a most zoomed out image tile, a previously depicted portion of the floorplan for the user device 204, or another appropriate portion of the floorplan.

A presentation criteria can include one or more properties for the merged graphics layer 206 that indicate whether the graphics system 202 should generate image tiles 210b for the vector image 210a. These properties can indicate whether tiling is enabled for the merged graphics layer 206, for an entity associated with the merged graphics layer 206, or both. An entity associated with a merged graphics layer 206 can be an organization or a building to which the merged graphics layer 206 applies. For instance, a building can have multiple merged graphics layers 206, one for each floor or another area within the building, and the presentation criteria can be the same for each floor or other area within the building. The smart renderer 214 can determine that the presentation criteria are satisfied when the one or more properties indicate that tiling is enabled for the merged graphics layer 206.

Whether or not the presentation criteria include one or more properties for the merged graphics layer 206, the smart renderer 214 can determine whether one or more image tiles 210b have been generated for the merged graphics layer 206, e.g., as another presentation criteria. This can include the smart renderer 214 determining whether one or more image tiles 210b have been generated for a portion of the merged graphics layer 206 that would be presented in a user interface. The smart renderer 214 can determine this portion using data included in the floorplan request received from the user device 204, e.g., that indicates which parts of the floorplan will be initially presented in the user interface.

The smart renderer 214 can determine whether a threshold quantity of image tiles 210b have been generated for the merged graphics layer 206. The threshold quantity can be determined to reduce a likelihood that the user device 204 will request an image tile that has not yet been generated by the tile generation module 212.

In situations when the smart renderer 214 determined that the presentation criteria are satisfied and to send image tiles 210b to the user device, but an image tile required for presentation in the user interface is not yet generated, e.g., for a subsequent image tile request, the smart renderer 214 can determine that the vector image 210a should be sent to the user device instead of sending more image tiles 210b to the user device 204.

This can occur when the smart renderer 214 initially determines to send image tiles 210b to the user device 204 even though only some of the image tiles for the merged graphics layer 206 have been generated. As the interactive layer 208 detects user interaction with the merged graphics layer 206, the graphics system 202 can send additional image tiles to the user device 204 for presentation in the user interface, e.g., in response to requests generated using data from the interactive layer 208 implemented on the user device 204. One of these later requests can include a request for presentation of an image tile 210b that the tile generation module 212 has not generated, either finished generating or even begun generating. As a result, the graphics system 202 does not have an image tile of the appropriate resolution to send to the user device 204. Because of this, the smart renderer 214 can determine to send, to the user device 204, image tiles for a different resolution, e.g., a higher or lower resolution, the vector image 210a, or both.

For instance, the smart renderer 214 can determine to initially send image tiles 210b of a different resolution to the user device 204. While the user device 204 presents the image tiles 210b of a different resolution than the requested image tile 210b, the smart renderer 214 can cause the graphics system 202 to send the vector image 210a to the user device 204. This can enable the user device 204 to present content more quickly, e.g., using the image tiles of the different resolution, while the user device 204 receives the vector image 210a that the user device 204 can then use for presentation of the floorplan in the user interface.

In some implementations, the presentation criteria can include criteria for properties of the user device 204, a display that will present the user interface that includes data from the merged graphics layer 206, or both. For instance, the presentation criteria can include a minimum number of processor cores, a minimum processor speed, a minimum amount of random access memory ("RAM"), a minimum amount of available RAM, a minimum display resolution, a maximum display resolution, a network bandwidth, whether the user device 204 includes an integrated or separate graphics processor, or a combination of two or more of these. The presentation criteria for a processor can be for a central processing unit, a graphics processing unit, or both.

When the smart renderer 214 determines that the user device 204 presentation criteria are satisfied, the smart renderer 214 determines to cause the graphics system 202 to provide image tiles 210b to the user device 204. This can occur when the user device's 204 processor has fewer cores than the minimum number of cores, processor has a speed that is less than the minimum processor speed, an amount of RAM is less than the minimum amount of RAM, an amount of available RAM is less than the minimum amount of available RAM, network bandwidth is less than the network bandwidth requirement, or a combination of two or more of these, to name a few examples. In some examples, the smart renderer 214 can determine that the presentation criteria are satisfied when the user device 204 has an integrated graphics processor that is part of the user device's 204 central processing unit, e.g., instead of a graphics processing unit separate from the central processing unit.

The graphics system 202 is an example of a system implemented as computer programs on one or more computers in one or more locations, in which the systems, components, and techniques described in this document are implemented. The user device 204 may include personal computers, mobile communication devices, and other devices that can send and receive data over a network. The network (not shown), such as a local area network (LAN), wide area network (WAN), the Internet, or a combination thereof, connects the user device 204, and the graphics system 202. The graphics system 202 may use a single server computer or multiple server computers operating in conjunction with one another, including, for example, a set of remote computers deployed as a cloud computing service.

The graphics system 202 can include several different functional components, including the tile generation module 212, and the smart renderer 214. The tile generation module 212, the smart renderer 214, or a combination of these, can include one or more data processing apparatuses. For instance, each of the tile generation module 212, and the smart renderer 214 can include one or more data processors and instructions that cause the one or more data processors to perform the operations discussed herein.

The various functional components of the graphics system 202 may be installed on one or more computers as separate functional components or as different modules of a same functional component. For example, the tile generation module 212, the smart renderer 214, or both, can be implemented as computer programs installed on one or more computers in one or more locations that are coupled to each through a network. In cloud-based systems for example, these components can be implemented by individual computing nodes of a distributed computing system.

Figure 3:
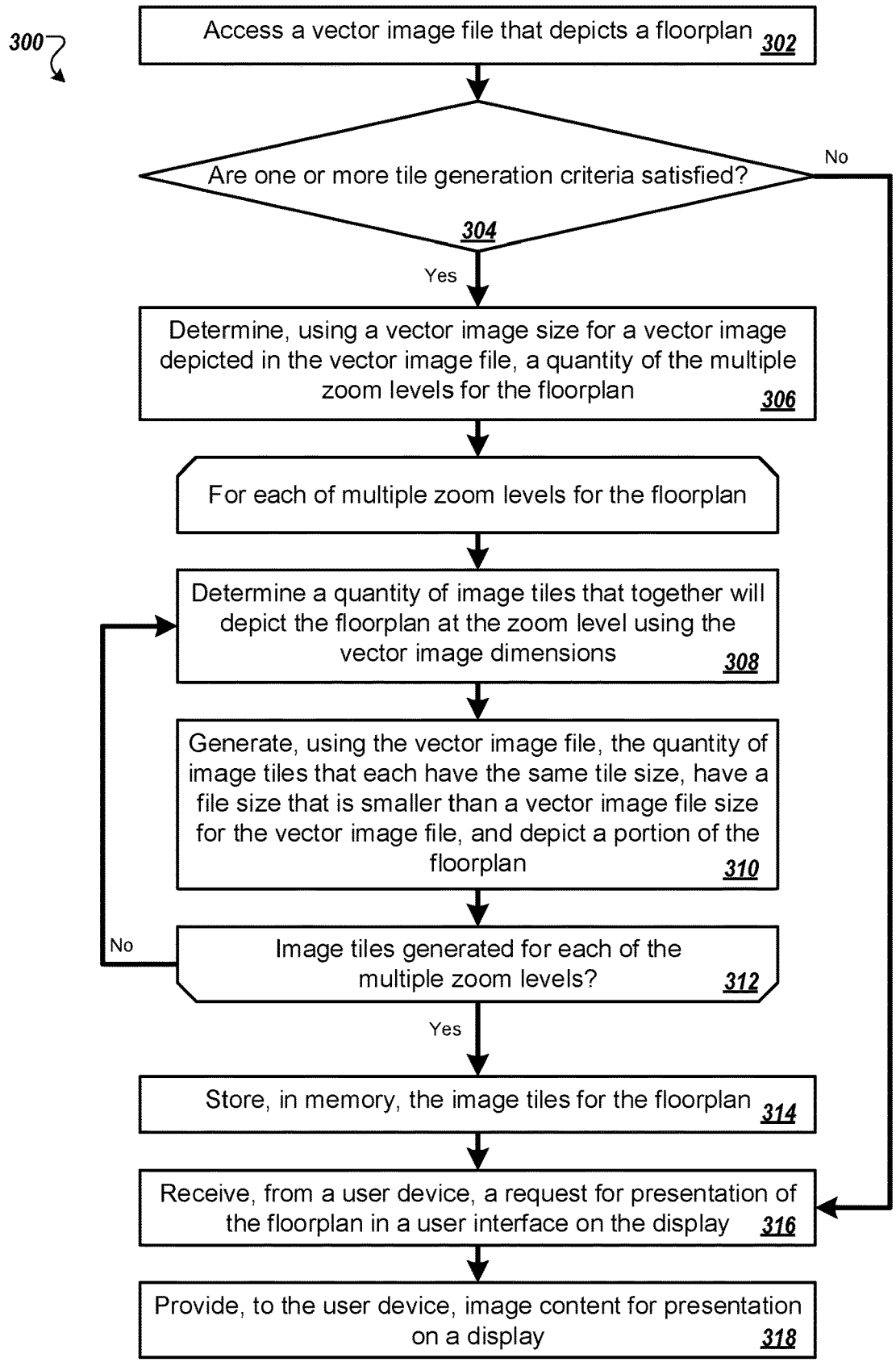
FIG. 3 is a flow diagram of a process for providing image content of a floorplan for presentation on a display.

FIG. 3 is a flow diagram of a process 300 for providing image content of a floorplan for presentation on a display. For example, the process 300 can be used by the graphics system 202, e.g., the tile generation module 212, from the environment 200.

A graphics system accesses a vector image file that depicts a floorplan (302). The graphics system can receive the vector image from another component in a larger system, such as the system 100 described with reference to FIG. 1, retrieve the vector image from a memory, or otherwise access the vector image. The vector image file depicts a vector image of the entire floorplan, and has a larger file size and depicts more information than an image tile. In some examples, the vector image file can be an SVG file.

A floorplan is a map for an area, such as a building or a park, and can include information for multiple different levels or a single level. A floorplan can include data for a single level within a multilevel area, e.g., a single floor in a building. In some examples, a floorplan includes data for a portion of an area, e.g., part of a floor within a building or a portion of a park.

The graphics system determines whether one or more tile generation criteria are satisfied (304). In some examples, the graphics system can determine whether a single tile generation criteria is satisfied. The tile generation criteria can be any appropriate tile generation criteria, such as those discussed in more detail above. For instance, the graphics system can determine whether the vector image file size satisfies a threshold file size. The graphics system can determine whether a vector image size, e.g., in x-y coordinates, satisfies a threshold size. As noted above, the vector image is the content depicted in the vector image file.

In response to determining that the tile generation criteria are satisfied, the graphics system determines, using a vector image size for a vector image depicted in the vector image file, a quantity of the multiple zoom levels for the floorplan (306). The graphics system can make this determining using a tile size for the image tiles that will be generated. The tile size can be a predetermined tile size for each of the image tiles. In some examples, the predetermined tile size can be 1024 pixels by 1024 pixels, or another appropriate tile size. The graphics system can make this determining using size, e.g., in pixels, of the vector image.

The graphics system can determine, for each of multiple zoom levels for the floorplan, a quantity of image tiles that together will depict the floorplan at the zoom level using the vector image dimensions (308). For instance, a set of multiple image tiles, e.g., two or more, together depict a floorplan for a particular zoom level of the floorplan. Each image tile individually depicts some content for the floorplan at the particular zoom level, has a tile size that is the same as the other tiles and a file size smaller than a vector image file size. The graphics system can determine how many image tiles will be in a set for any particular zoom level. A most zoomed out zoom level can have a quantity of one. Other zoom levels can have various different quantities, such as sixteen, eighteen, or twenty-five.

In some implementations, as part of the image tile quantity determination, the graphics system can determine vector image dimensions for a zoom level from the multiple zoom levels. The vector image dimensions can be in x-y coordinates. The graphics system can then determine the quantity of image tiles that together will depict the floorplan at the zoom level using the vector image dimensions.

The graphics system generates, using the vector image file, the quantity of image tiles that each have the same tile size, have a file size that is smaller than a vector image file size for the vector image file, and depict a portion of the floorplan (310). The tile size is a size of a tile in x-y coordinates. As discussed above, the tile size can be a predetermined tile size. The image tiles for a particular zoom level can together depict the floorplan at the particular zoom level.

As part of the generation process the graphics system generates two or more image tiles throughout all of the zoom levels. This can include generating one image tile for one zoom level, and at least two image tiles for another zoom level. The quantity of image tiles that the graphics system generates can vary based on the quantity of the multiple zoom levels, the vector image size, the tile size, or a combination of these.

In some examples, the graphics system can generate, using the vector image file, the two or more image tiles that each have one or more first coordinates that indicate a location of the respective image tile within the floorplan, and a second coordinate that represents the zoom level from the multiple zoom levels of the content depicted in the respective image tile. The first coordinates can include an x-coordinate and a y-coordinate. The second coordinates can include a z-coordinate that represents the zoom level.

The graphics system determines whether image tiles have been generated for each of the multiple zoom levels (312). For instance, the graphics system determines whether the graphics system has performed steps 308 and 310 for each zoom level in the quantity of zoom levels. When the graphics system has not generated image tiles for each of the multiple zoom levels, the graphics system proceeds to perform step 308 for another zoom level for which image tiles have not been generated. The graphics system repeats this process until image tiles for all zoom levels have been generated.

The graphics system stores, in memory, the image tiles for the floorplan (314). For instance, the graphics system stores the image tiles in a database included in, or accessible by, the graphics system. The graphics system can associate the image tiles with a merged graphics layer that includes an interactive layer and an image layer, e.g., the latter of which is represented by the image tiles. This can include storing an image tile in memory with an identifier for the corresponding merged graphics layer.

The graphics system receives, from a user device, a request for presentation of the floorplan in a user interface on the display (316). This can occur after the graphics system determines that the tile generate criteria are not satisfied or after the graphics system stores the image tiles for the floorplan in memory.

The request can be for presentation of the floorplan in a web browser or another application that is executing on the user device. For instance, the graphics system, or another component of a system to which the graphics system belongs, can receive the request from a native floorplan presentation application that is executing on the user device.

The graphics system provides, to the user device, image content for presentation on a display (318). Depending on whether the graphics system generated image tiles for the floorplan, or one or more other presentation criteria described in this document are satisfied, the graphics system can provide the vector image file or one or more image tiles as the image content. For instance, the graphics system can perform one or more steps in the process 400, described in more detail below, to determine the image content to provide.

In some examples, the graphics system can determine a portion of the floorplan to depict in the user interface. The graphics system can retrieve, from memory, multiple image tiles that together depict the portion of the floorplan, e.g., using the coordinates for the image tiles. The graphics system can then provide, to the user device, (i) the multiple image tiles and (ii) instructions to cause presentation of the multiple images tiles in the user interface on the display.

The order of steps in the process 300 described above is illustrative only, and providing the image content of the floorplan for presentation on a display can be performed in different orders. For example, the graphics system can determine whether a file size of a vector image satisfies a threshold prior to receiving the vector image file. The graphics system can determine the vector image file size, e.g., by retrieving the file size from memory, and then determine whether the file size satisfies the threshold.

In some examples, the graphics system can receive the request for presentation of the floorplan prior to accessing the vector image file. For instance, the graphics system can receive the request and then retrieve the vector image file from memory. In some implementations, the graphics system need not access the vector image file and can instead receive the request for presentation of the floorplan and then determine whether the vector image file size satisfies the threshold file size or another tile generation criteria is satisfied. When at least one tile generation criteria is satisfied, the graphics system can generate image tiles, e.g., using steps 308 through 312. While the graphics system generates the image tiles, the graphics system can provide the vector image to the user device. The graphics system can then store the generated image tiles in memory for use responding to a future request for presentation of the floorplan in a user interface.

In some implementations, the process 300 can include additional steps, fewer steps, or some of the steps can be divided into multiple steps. For example, the graphics system can perform steps 304, 310, and 314 without performing the other steps in the process 300. In some examples, the graphics system can perform steps 304, 316, and 318 without performing the other steps in the process 300.

Figure 4:
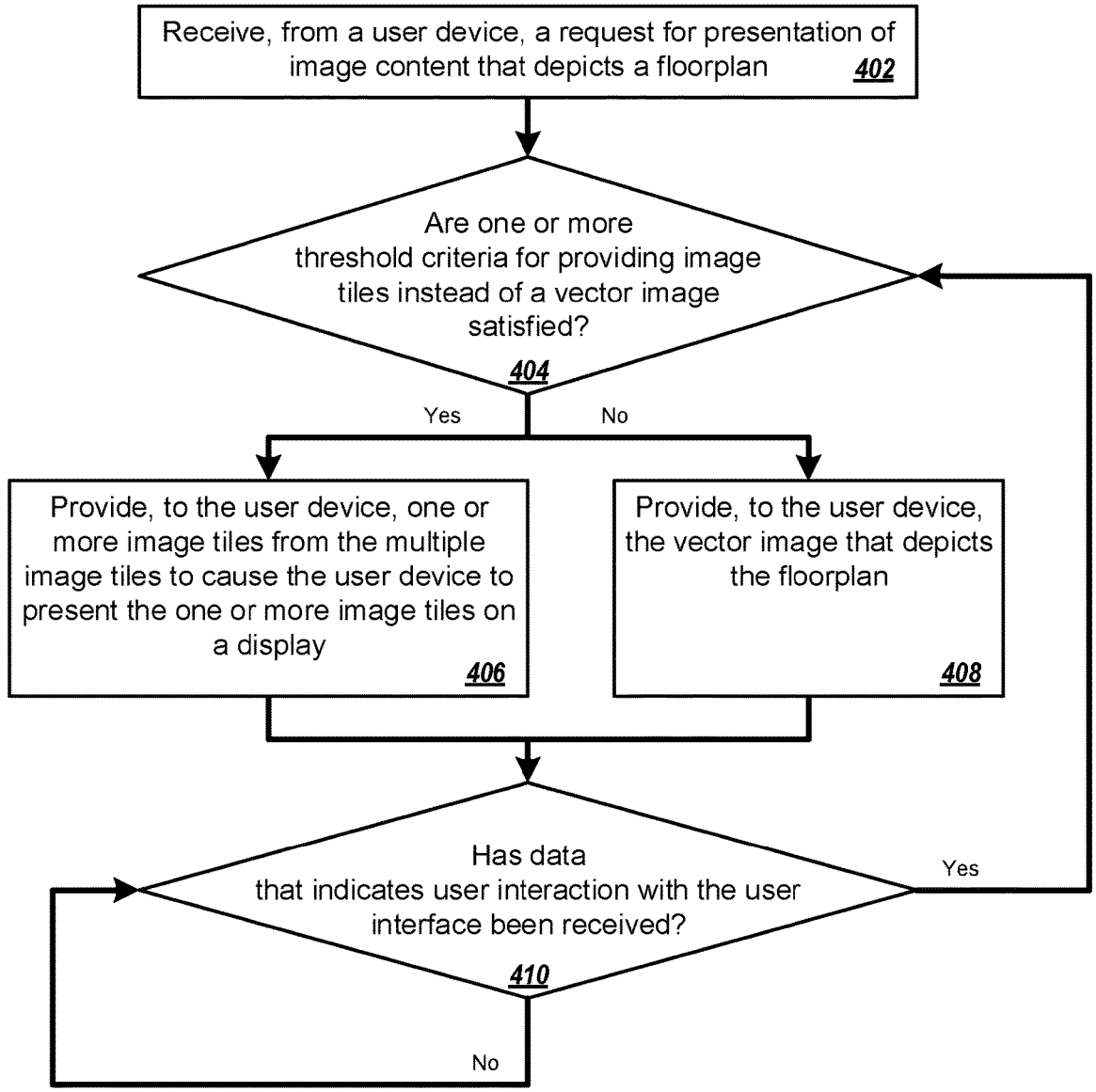
FIG. 4 is a flow diagram of a process for providing image content to a user device.

FIG. 4 is a flow diagram of a process 400 for providing image content to a user device, e.g., as part of a merged graphics layer. The image content can include one or more image tiles or a vector image. For example, the process 400 can be used by the graphics system 202, e.g., the smart renderer 214, from the environment 200.

A graphics system receives, from a user device, a request for presentation of image content that depicts a floorplan (402). The graphics system can use any appropriate protocol to receive the request from the user device, e.g., any appropriate network communication protocol.

A floorplan is a map for an area, such as a building or a park, and can include information for multiple different levels or a single level. A floorplan can include data for a single level within a multilevel area, e.g., a single floor in a building.

The graphics system determines whether one or more threshold criteria for providing image tiles instead of a vector image are satisfied (404). In some implementations, this determination can include a determination whether to provide multiple image tiles that depict the floorplan or to provide a vector image that depicts the floorplan.

The threshold criteria can be those described above, e.g., a presentation criteria. For instance, the graphics system can determine whether multiple image tiles are available for presentation of the floorplan such that the indication whether the image tiles are available is a threshold criteria. The graphics system can determine whether the graphics system, e.g., a tile generation module, has finished rendering the multiple image tiles using the vector image. That the graphics system has finished rendering the multiple image tiles can be a threshold criteria.

In some implementations, the graphics system can determine one or more properties of the user device. The graphics system can determine whether the one or more properties of the user device satisfy one or more threshold property values. When the one or more properties of the user device satisfy the one or more threshold property values, the graphics system can determine that the one or more threshold criteria are satisfied.

In some examples, the graphics system can determine, as a threshold criteria, whether settings data indicates that tiling is enabled for the floorplan. When the settings data indicates that tiling is enabled, the graphics system, e.g., a tile generation module, can generate, using the vector image, multiple image tiles for the floorplan that each have the same tile size, have a file size that is smaller than a vector image file size for the vector image, and depict a portion of the floorplan. For instance, the graphics system can use one or more steps in the process 300 described above to generate the multiple image tiles.

A set of multiple image tiles, e.g., two or more, together depict a floorplan for a particular zoom level of the floorplan. Each image tile individually depicts some content for the floorplan at the particular zoom level, has a tile size that is the same as the other tiles and a file size smaller than a vector image file size. The tile size can be a size of a tile in x-y coordinates.

A vector image file depicts the entire floorplan, and has a larger file size than a tile image file size and depicts more information than an image tile. In some examples, a vector image file can be an SVG file.

In response to determining that one or more threshold criteria for providing image tiles instead of a vector image are satisfied, the graphics system provides, to the user device, one or more image tiles from the multiple image tiles to cause the user device to present the one or more image tiles on a display (406). In some examples, when the graphics system has two or more threshold criteria, the graphics system must determine that all of the threshold criteria, or a combination of two or more of the threshold criteria, are satisfied before providing the one or more image tiles to the user device. In some implementations, when the graphics system has two or more threshold criteria, the graphics system need only determine that one of the two or more threshold criteria is satisfied before providing the one or more image tiles to the user device.

The graphics system can use any appropriate communication protocol to provide the image tiles to the user device. For instance, the graphics system can use the same network communication protocol with which the graphics system received the request to provide the image tiles to the user device.

In response to determining that one or more threshold criteria for providing image tiles instead of a vector image are not satisfied, the graphics system provides, to the user device, the vector image that depicts the floorplan (408). For instance, when tiling is not enabled, tiles are not available, the one or more properties of the user device do not satisfy the one or more threshold properties, or a combination of these, the graphics system can provide the vector image.

The graphics system can use any appropriate communication protocol to provide the vector image to the user device. For instance, the graphics system can use the same network communication protocol with which the graphics system received the request to provide the vector image to the user device.

The graphics system determines whether data that indicates user interaction with the user interface has been received (410). For instance, when the graphics system provides image content, e.g., image tiles or a vector image, as part of a merged graphics layer, the merged graphics layer can include an interactive layer. The graphics system can provide the merged graphics layer that includes the interactive layer and either the vector image or some of the image tiles to the user device, e.g., as part of step 406 or step 408.

Providing the interactive layer, e.g., data for the interactive layer, to the user device can cause the user device to present, in a user interface concurrently with presentation of the one or more image tiles or the vector image, the interactive layer that detects user interaction with the user interface. The user device can then use the interactive layer to detect user interact with the user interface, such as a zoom action, a pan action, or an action that selects part of the floorplan such as an object. Such a selection can be part of a request for additional information about the selected part of the floorplan. When the user interaction occurs, the graphics system can receive, from the interactive layer presented at the user device, data that indicates the user interaction with the user interface.

In implementations in which the graphics system provides image tiles to the user device before the image tiles are required for presentation, e.g., as part of an image tile caching process, the interactive layer might not send data that indicates the user interaction to the graphics system. For instance, the merged graphics layer at the user device can determine whether the required image tiles are cached in a memory for the user device. If the required images tiles are cached, the merged graphics layer can use the cached image tiles to update the user interface. If the required image tiles are not cached, the merged graphics layer can send the user interaction data to the graphics system. This can cause the graphics system to retrieve the required image tiles and provide the retrieved image tiles to the user device for presentation.

When the interactive layer detects a pan or a zoom operation for a merged graphics layer that includes image tiles, the interactive layer can communicate with the graphics system, if necessary, to retrieve the required image tiles for presentation. When the merged graphics layer includes a vector image and the interactive layer detects a pan or a zoom operation, the merged graphics layer can use the detected user interaction to update a portion of the vector image that is presented in the user interface.

When the interactive layer detects other user interaction with the merged graphics layer, such as selection of an object, the merged graphics layer communicates with the graphics system or another system that includes the graphics system. This can include the merged graphics layer requesting additional information for the selected object, scheduling a meeting that uses a physical object represented by the selected object, e.g., when the object represents a physical conference room, or performing another appropriate action.

In some implementations, when the graphics system does not receive data from the interactive layer that indicates user interaction, the graphics system can wait until data is received. In some examples, when the graphics system does not receive data from the interactive layer that indicates user interaction, the graphics system can end the process 400.

In some implementations, the graphics system might receive data from the interactive layer that causes the graphics system to perform one or more other steps in the process 400. For instance, the data that indicates the user interaction might indicate a refresh of the user interface that presents a vector image, such as a page refresh in a web browser that presents the merged graphics layer. In these implementations, the graphic system can proceed to step 404 and determine whether the one or more threshold criteria for providing image tiles instead of a vector image are satisfied.

For example, the graphics system might initially provide one or more image tiles to the user device. The graphics system might receive data that indicates a user interaction modifying at least a portion of the floorplan. This can cause the graphics system to perform one or more steps of the process 300 to generate new image tiles. The graphics system can then receive data that indicates a refresh of the user interface. In response, the graphics system can determine whether the one or more threshold criteria are satisfied. In this example, because the graphics system is still generating new image tiles but has a new vector image based on the modification to the floorplan, the graphics system determines that the one or more criteria are not satisfied and provides the vector image to the user device.

In some examples, the graphics system can provide a vector image to the user device, and then detect a refresh user interaction. In response to the detection, the graphics system can determine that the one or more threshold criteria are satisfied and then provide one or more image tiles to the user device. The graphics system might perform the steps described in this paragraph as part of the example described in the above paragraph or separately, e.g., when the graphics system initially provides a vector image to the user device.

The order of steps in the process 400 described above is illustrative only, and providing the image content to a user device can be performed in different orders. For example, the graphics system can determine whether the one or more threshold criteria are satisfied and then receive the request for presentation of the image content.

In some implementations, the process 400 can include additional steps, fewer steps, or some of the steps can be divided into multiple steps. For example, the graphics system can receive the request, determine whether the threshold criteria are satisfied, and then provide the one or more image tiles, or provide the vector image, without performing the other steps in the process 400.

In some examples, after providing the one or more image tiles to the user device, the graphics system can receive data that indicates a visual update to the floorplan. In response, the graphics system, e.g., a tile generation module, can generate an updated vector image that depicts an updated floorplan including the visual update to the floorplan. The graphics system can store the updated vector image in memory. The graphics system can determine whether to generate multiple image tiles for the vector image, e.g., using one or more steps from the process 300, described above.

In some implementations, the graphics system can provide a merged graphics layer for a floorplan to multiple different devices. The merged graphics layer can be the same or a different merged graphics layer for the floorplan. For instance, the graphics system can provide a first merged graphics layer to a first user device. The first merged graphics layer can include a vector image or multiple image tiles.

The graphics system, or a system that includes the graphics system, can receive an update for the floorplan. As a result of the update, the graphics system can update the floorplan using the received data. This can include generating an updated vector image, updated image tiles, or both.

The graphics system can then provide a second, different merged graphics layer to a second user device. The second user device can be a different user device than the first user device or can be the same user device. The second, different merged graphics layer is different from the first merged graphics layer because it includes the updated vector image or the updated image tiles. The graphics system can provide the second, different merged graphics layer to the second user device in response to receipt of a request for presentation of the floorplan in a user interface.

In some implementations, the graphics system can use settings data to determine whether tiling is enabled. Tiling can be enabled for a floorplan, an entity associated with the floorplan, e.g., the building that includes a floor represented by the floorplan or a company that owns the building, or both. The graphics system can use the settings data to determine whether to search for image tiles for a floorplan, generate image tiles for a floorplan, or both.

For instance, when the graphics system receives a request for presentation of a floorplan, e.g., a new request or a user interface request, the graphics system can use the data to determine whether to search for image tiles. If the settings data indicates that tiling is enabled, the graphics system can search for tile images. If no tile images have been generated, or if an insufficient quantity of tile images for the floorplan have been generated, the graphics system can determine that the one or more threshold criteria are not satisfied. If tile images have been generated, the graphics system can provide some of the tile images to the user device.

In some examples, when the graphics system does not find tile images for a floorplan, the graphics system can determine whether to generate tile images for the floorplan. For example, the graphics system can determine whether the settings data indicates that tiling is enabled. If tiling is not enabled, the graphics system can determine to skip generation of image tiles. If tiling is enabled, the graphics system can begin generating image tiles for the floorplan, e.g., if the tile generation process has not already started.

A number of implementations have been described. Nevertheless, it will be understood that various modifications may be made without departing from the spirit and scope of the disclosure. For example, various forms of the flows shown above may be used, with steps re-ordered, added, or removed.

Embodiments of the subject matter and the functional operations described in this specification can be implemented in digital electronic circuitry, in tangibly-embodied computer software or firmware, in computer hardware, including the structures disclosed in this specification and their structural equivalents, or in combinations of one or more of them. Embodiments of the subject matter described in this specification can be implemented as one or more computer programs, i.e., one or more modules of computer program instructions encoded on a tangible non-transitory program carrier for execution by, or to control the operation of, data processing apparatus. Alternatively or in addition, the program instructions can be encoded on an artificially-generated propagated signal, e.g., a machine-generated electrical, optical, or electromagnetic signal, that is generated to encode information for transmission to suitable receiver apparatus for execution by a data processing apparatus. The computer storage medium can be a machine-readable storage device, a machine-readable storage substrate, a random or serial access memory device, or a combination of one or more of them.

The term "data processing apparatus" refers to data processing hardware and encompasses all kinds of apparatus, devices, and machines for processing data, including by way of example a programmable processor, a computer, or multiple processors or computers. The apparatus can also be or further include special purpose logic circuitry, e.g., an FPGA (field programmable gate array) or an ASIC (application-specific integrated circuit). The apparatus can optionally include, in addition to hardware, code that creates an execution environment for computer programs, e.g., code that constitutes processor firmware, a protocol stack, a database management system, an operating system, or a combination of one or more of them.

A computer program, which may also be referred to or described as a program, software, a software application, a module, a software module, a script, or code, can be written in any form of programming language, including compiled or interpreted languages, or declarative or procedural languages, and it can be deployed in any form, including as a stand-alone program or as a module, component, subroutine, or other unit suitable for use in a computing environment. A computer program may, but need not, correspond to a file in a file system. A program can be stored in a portion of a file that holds other programs or data, e.g., one or more scripts stored in a markup language document, in a single file dedicated to the program in question, or in multiple coordinated files, e.g., files that store one or more modules, sub-programs, or portions of code. A computer program can be deployed to be executed on one computer or on multiple computers that are located at one site or distributed across multiple sites and interconnected by a communication network.

The processes and logic flows described in this specification can be performed by one or more programmable computers executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application-specific integrated circuit).

Computers suitable for the execution of a computer program include, by way of example, general or special purpose microprocessors or both, or any other kind of central processing unit. Generally, a central processing unit will receive instructions and data from a read-only memory or a random access memory or both. The essential elements of a computer are a central processing unit for performing or executing instructions and one or more memory devices for storing instructions and data. Generally, a computer will also include, or be operatively coupled to receive data from or transfer data to, or both, one or more mass storage devices for storing data, e.g., magnetic, magneto-optical disks, or optical disks. However, a computer need not have such devices. Moreover, a computer can be embedded in another device, e.g., a mobile telephone, a smart phone, a personal digital assistant (PDA), a mobile audio or video player, a game console, a Global Positioning System (GPS) receiver, or a portable storage device, e.g., a universal serial bus (USB) flash drive, to name just a few.

Computer-readable media suitable for storing computer program instructions and data include all forms of non-volatile memory, media and memory devices, including by way of example semiconductor memory devices, e.g., EPROM, EEPROM, and flash memory devices; magnetic disks, e.g., internal hard disks or removable disks; magneto-optical disks; and CD-ROM and DVD-ROM disks. The processor and the memory can be supplemented by, or incorporated in, special purpose logic circuitry.

To provide for interaction with a user, embodiments of the subject matter described in this specification can be implemented on a computer having a display device, e.g., LCD (liquid crystal display), OLED (organic light emitting diode) or other monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input. In addition, a computer can interact with a user by sending documents to and receiving documents from a device that is used by the user; for example, by sending web pages to a web browser on a user's device in response to requests received from the web browser.

Embodiments of the subject matter described in this specification can be implemented in a computing system that includes a back-end component, e.g., as a data server, or that includes a middleware component, e.g., an application server, or that includes a front-end component, e.g., a client computer having a graphical user interface or a Web browser through which a user can interact with an implementation of the subject matter described in this specification, or any combination of one or more such back-end, middleware, or front-end components. The components of the system can be interconnected by any form or medium of digital data communication, e.g., a communication network. Examples of communication networks include a local area network (LAN) and a wide area network (WAN), e.g., the Internet.

The computing system can include clients and servers. A client and server are generally remote from each other and typically interact through a communication network. The relationship of client and server arises by virtue of computer programs running on the respective computers and having a client-server relationship to each other. In some embodiments, a server transmits data, e.g., an HyperText Markup Language (HTML) page, to a user device, e.g., for purposes of displaying data to and receiving user input from a user interacting with the user device, which acts as a client. Data generated at the user device, e.g., a result of the user interaction, can be received from the user device at the server.

Figure 5:
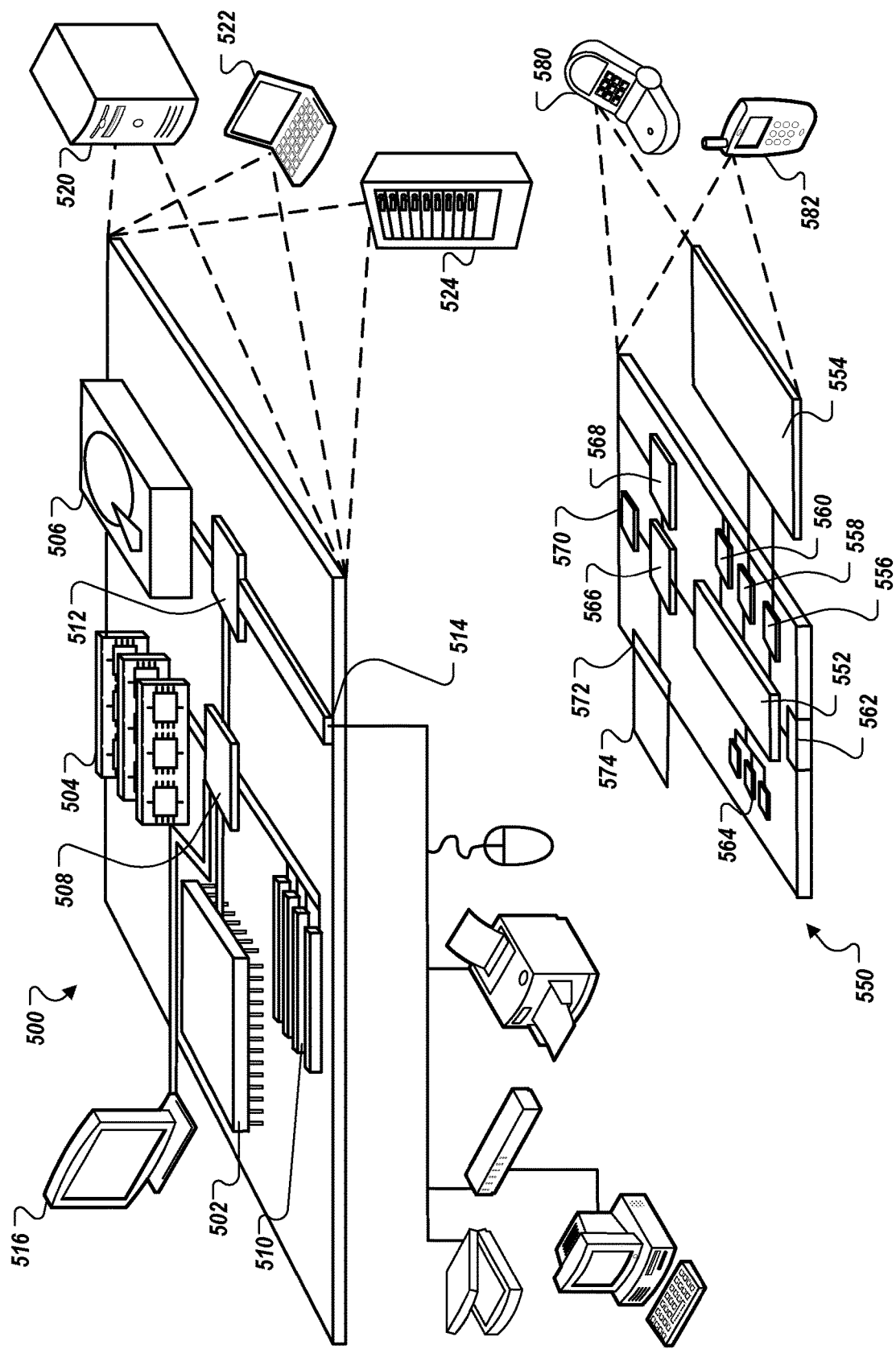
FIG. 5 is a block diagram of a computing system that can be used in connection with computer-implemented methods described in this document.

FIG. 5 is a block diagram of computing devices 500, 550 that may be used to implement the systems and methods described in this document, as either a client or as a server or plurality of servers. Computing device 500 is intended to represent various forms of digital computers, such as laptops, desktops, workstations, personal digital assistants, servers, blade servers, mainframes, and other appropriate computers. Computing device 550 is intended to represent various forms of mobile devices, such as personal digital assistants, cellular telephones, smartphones, smartwatches, head-worn devices, and other similar computing devices. The components shown here, their connections and relationships, and their functions, are meant to be exemplary only, and are not meant to limit implementations described and/or claimed in this document.

Computing device 500 includes a processor 502, memory 504, a storage device 506, a high-speed interface 508 connecting to memory 504 and high-speed expansion ports 510, and a low speed interface 512 connecting to low speed bus 514 and storage device 506. Each of the components 502, 504, 506, 508, 510, and 512, are interconnected using various busses, and may be mounted on a common motherboard or in other manners as appropriate. The processor 502 can process instructions for execution within the computing device 500, including instructions stored in the memory 504 or on the storage device 506 to display graphical information for a GUI on an external input/output device, such as display 516 coupled to high speed interface 508. In other implementations, multiple processors and/or multiple buses may be used, as appropriate, along with multiple memories and types of memory. Also, multiple computing devices 500 may be connected, with each device providing portions of the necessary operations (e.g., as a server bank, a group of blade servers, or a multi-processor system).

The memory 504 stores information within the computing device 500. In one implementation, the memory 504 is a computer-readable medium. In one implementation, the memory 504 is a volatile memory unit or units. In another implementation, the memory 504 is a non-volatile memory unit or units.

The storage device 506 is capable of providing mass storage for the computing device 500. In one implementation, the storage device 506 is a computer-readable medium. In various different implementations, the storage device 506 may be a floppy disk device, a hard disk device, an optical disk device, or a tape device, a flash memory or other similar solid state memory device, or an array of devices, including devices in a storage area network or other configurations. In one implementation, a computer program product is tangibly embodied in an information carrier. The computer program product contains instructions that, when executed, perform one or more methods, such as those described above. The information carrier is a computer- or machine-readable medium, such as the memory 504, the storage device 506, or memory on processor 502.

The high speed controller 508 manages bandwidth-intensive operations for the computing device 500, while the low speed controller 512 manages lower bandwidth-intensive operations. Such allocation of duties is exemplary only. In one implementation, the high-speed controller 508 is coupled to memory 504, display 516 (e.g., through a graphics processor or accelerator), and to high-speed expansion ports 510, which may accept various expansion cards (not shown). In the implementation, low-speed controller 512 is coupled to storage device 506 and low-speed expansion port 514. The low-speed expansion port, which may include various communication ports (e.g., USB, Bluetooth, Ethernet, wireless Ethernet) may be coupled to one or more input/output devices, such as a keyboard, a pointing device, a scanner, or a networking device such as a switch or router, e.g., through a network adapter.

The computing device 500 may be implemented in a number of different forms, as shown in the figure. For example, it may be implemented as a standard server 520, or multiple times in a group of such servers. It may also be implemented as part of a rack server system 524. In addition, it may be implemented in a personal computer such as a laptop computer 522. Alternatively, components from computing device 500 may be combined with other components in a mobile device (not shown), such as device 550. Each of such devices may contain one or more of computing device 500, 550, and an entire system may be made up of multiple computing devices 500, 550 communicating with each other.

Computing device 550 includes a processor 552, memory 564, an input/output device such as a display 554, a communication interface 566, and a transceiver 568, among other components. The device 550 may also be provided with a storage device, such as a microdrive or other device, to provide additional storage. Each of the components 550, 552, 564, 554, 566, and 568, are interconnected using various buses, and several of the components may be mounted on a common motherboard or in other manners as appropriate.

The processor 552 can process instructions for execution within the computing device 550, including instructions stored in the memory 564. The processor may also include separate analog and digital processors. The processor may provide, for example, for coordination of the other components of the device 550, such as control of user interfaces, applications run by device 550, and wireless communication by device 550.

Processor 552 may communicate with a user through control interface 558 and display interface 556 coupled to a display 554. The display 554 may be, for example, a TFT LCD display or an OLED display, or other appropriate display technology. The display interface 556 may comprise appropriate circuitry for driving the display 554 to present graphical and other information to a user. The control interface 558 may receive commands from a user and convert them for submission to the processor 552. In addition, an external interface 562 may be provided in communication with processor 552, so as to enable near area communication of device 550 with other devices. External interface 562 may provide, for example, for wired communication (e.g., via a docking procedure) or for wireless communication (e.g., via Bluetooth or other such technologies).

The memory 564 stores information within the computing device 550. In one implementation, the memory 564 is a computer-readable medium. In one implementation, the memory 564 is a volatile memory unit or units. In another implementation, the memory 564 is a non-volatile memory unit or units. Expansion memory 574 may also be provided and connected to device 550 through expansion interface 572, which may include, for example, a SIMM card interface. Such expansion memory 574 may provide extra storage space for device 550, or may also store applications or other information for device 550. Specifically, expansion memory 574 may include instructions to carry out or supplement the processes described above, and may include secure information also. Thus, for example, expansion memory 574 may be provided as a security module for device 550, and may be programmed with instructions that permit secure use of device 550. In addition, secure applications may be provided via the SIMM cards, along with additional information, such as placing identifying information on the SIMM card in a non-hackable manner.

The memory may include for example, flash memory and/or MRAM memory, as discussed below. In one implementation, a computer program product is tangibly embodied in an information carrier. The computer program product contains instructions that, when executed, perform one or more methods, such as those described above. The information carrier is a computer- or machine-readable medium, such as the memory 564, expansion memory 574, or memory on processor 552.

Device 550 may communicate wirelessly through communication interface 566, which may include digital signal processing circuitry where necessary. Communication interface 566 may provide for communications under various modes or protocols, such as GSM voice calls, SMS, EMS, or MMS messaging, CDMA, TDMA, PDC, WCDMA, CDMA2000, or GPRS, among others. Such communication may occur, for example, through radio-frequency transceiver 568. In addition, short-range communication may occur, such as using a Bluetooth, WiFi, or other such transceiver (not shown). In addition, GPS receiver module 570 may provide additional wireless data to device 550, which may be used as appropriate by applications running on device 550.

Device 550 may also communicate audibly using audio codec 560, which may receive spoken information from a user and convert it to usable digital information. Audio codec 560 may likewise generate audible sound for a user, such as through a speaker, e.g., in a handset of device 550. Such sound may include sound from voice telephone calls, may include recorded sound (e.g., voice messages, music files, etc.) and may also include sound generated by applications operating on device 550.

The computing device 550 may be implemented in a number of different forms, as shown in the figure. For example, it may be implemented as a cellular telephone 580. It may also be implemented as part of a smartphone 582, personal digital assistant, or other similar mobile device.

Various implementations of the systems and techniques described here can be realized in digital electronic circuitry, integrated circuitry, specially designed ASICs (application specific integrated circuits), computer hardware, firmware, software, and/or combinations thereof. These various implementations can include implementation in one or more computer programs that are executable and/or interpretable on a programmable system including at least one programmable processor, which may be special or general purpose, coupled to receive data and instructions from, and to transmit data and instructions to, a storage system, at least one input device, and at least one output device.

These computer programs (also known as programs, software, software applications or code) include machine instructions for a programmable processor, and can be implemented in a high-level procedural and/or object-oriented programming language, and/or in assembly/machine language. As used herein, the terms "machine-readable medium" "computer-readable medium" refers to any computer program product, apparatus and/or device (e.g., magnetic discs, optical disks, memory, Programmable Logic Devices (PLDs)) used to provide machine instructions and/or data to a programmable processor, including a machine-readable medium that receives machine instructions as a machine-readable signal. The term "machine-readable signal" refers to any signal used to provide machine instructions and/or data to a programmable processor.

While this specification contains many specific implementation details, these should not be construed as limitations on the scope of what may be claimed, but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system modules and components in the embodiments described above should not be understood as requiring such separation in all embodiments, and it should be understood that the described program components and systems can generally be integrated together in a single software product or packaged into multiple software products.

In each instance where an HTML file is mentioned, other file types or formats may be substituted. For instance, an HTML file may be replaced by an XML, JSON, plain text, or other types of files. Moreover, where a table or hash table is mentioned, other data structures (such as spreadsheets, relational databases, or structured files) may be used.

Particular embodiments of the invention have been described. Other embodiments are within the scope of the following claims. For example, the steps recited in the claims, described in the specification, or depicted in the figures can be performed in a different order and still achieve desirable results. In some cases, multitasking and parallel processing may be advantageous.

What is claimed is:

1. A computer-implemented method comprising:
    receiving, from a user device, a request for presentation of image content that depicts a floorplan;
    determining whether one or more criteria for providing image tiles instead of a vector image that depicts the floorplan are satisfied, each of the image tiles having the same tile size, having a file size that is smaller than a vector image file size for the vector image, and depicting a portion of the floorplan, wherein determining whether the one or more criteria for providing image tiles instead of the vector image that depicts the floorplan are satisfied comprises determining whether the image tiles are available for presentation of the floorplan or to provide the vector image that depicts the floorplan; and in response to determining that the one or more criteria for providing image tiles instead of the vector image that depicts the floorplan are satisfied, providing, to the user device, one or more image tiles from the image tiles to cause the user device to present the one or more image tiles on a display.

2. The method of claim 1, comprising:
receiving, from a second user device, a second request for presentation of image content that depicts the floorplan;
determining, for the second request, whether the one or more criteria for providing the image tiles instead of the vector image that depicts the floorplan are satisfied; and
in response to determining that at least one of the one or more criteria are not satisfied, providing, to the second user device, the vector image that depicts the floorplan.

3. The method of claim 2, wherein:
determining whether the one or more criteria for providing image tiles instead of the vector image that depicts the floorplan are satisfied comprises determining whether the image tiles are available for presentation of the floorplan or to provide the vector image that depicts the floorplan; and
providing, to the second user device, the vector image that depicts the floorplan is responsive to determining that the image tiles are not available for presentation of the floorplan and to provide the vector image that depicts the floorplan.

4. The method of claim 3, wherein:
receiving the second request for presentation of image content that depicts the floorplan comprises:
after providing the one or more image tiles to the second user device, receiving data that indicates a visual update to the floorplan; and
in response to receiving the data that indicates the visual update to the floorplan, generating an updated vector image that depicts an updated floorplan including the visual update to the floorplan; and
providing the vector image that depicts the floorplan comprises providing the updated vector image that depicts the updated floorplan, the updated vector image being used to generate second image tiles.

5. The method of claim 2, wherein the second user device is the user device.

6. The method of claim 5, wherein providing the vector image occurs prior to receiving the second request.

7. The method of claim 5, comprising:
providing, to the user device, interactive layer data to cause the user device to present, in a user interface concurrently with presentation of the one or more image tiles or the vector image, an interactive layer that detects user interaction with the user interface; and
receiving, from the interactive layer presented at the user device, data that indicates user interaction with the user interface, the user interaction being at least one of a zoom action, a pan action, or an object selection action.

8. The method of claim 7, comprising:
in response to receiving the data that indicates the user interaction with the user interface, determining whether the user interaction indicates a request for a change in the content depicted in the user interface;
in response to determining that the user interaction indicates a request for a change in the content depicted in the user interface, determining one or more second image tiles from the image tiles to send to the user device based on the user interaction; and
providing, to the user device, the one or more second image tiles to cause the user device to present the one or more second image tiles on the display.

9. The method of claim 1, wherein receiving the request comprises receiving data that indicates a refresh of a user interface that presents the vector image that depicts the floorplan.

10. The method of claim 1, wherein receiving the request comprises receiving data that indicates a request for a change in a zoom level for the floorplan.

11. The method of claim 1, wherein determining whether the image tiles are available for presentation of the floorplan comprises determining whether a system has finished rendering the image tiles using the vector image.

12. The method of claim 11, wherein:
receiving the request for presentation of image content that depicts the floorplan comprises receiving the request for presentation of image content that depicts a particular zoom level for the floorplan; and
determining whether the system has finished rendering the multiple image tiles using the vector image comprises determining whether the system has finished rendering the multiple image tiles for the particular zoom level for the floorplan.

13. The method of claim 1, wherein determining whether the image tiles are available for presentation of the floorplan comprises determining whether tiling is enabled for the floorplan.

14. The method of claim 13, comprising:
storing, in memory, first data that indicates that tiling is not enabled for the floorplan;
receiving, from the user device, second data that indicates a refresh of a user interface that presents the vector image that depicts the floorplan; and
determining, using the first data that indicates that tiling is not enabled for the floorplan, to skip a search for image tiles for the floorplan.

15. The method of claim 13, comprising:
storing, in memory, first data that indicates that tiling is not enabled for the floorplan;
receiving, from the user device, second data that indicates a refresh of a user interface that presents the vector image that depicts the floorplan; and
determining, using the first data that indicates that tiling is not enabled for the floorplan, to skip generation of image tiles for the floorplan.

16. The method of claim 1, wherein:
determining whether the one or more criteria for providing image tiles instead of the vector image that depicts the floorplan are satisfied comprises:
determining one or more properties of the user device; and
determining whether the one or more properties of the user device satisfy one or more threshold property values; and
providing, to the user device, the one or more image tiles from the image tiles to cause the user device to present the one or more image tiles on a display is responsive to determining that the one or more properties of the user device satisfy the one or more threshold property values.

17. The method of claim 1, wherein the vector image comprises a scalable vector graphics file.

18. A non-transitory computer storage medium encoded with instructions that, when executed by one or more computers, cause the one or more computers to perform operations comprising:
- receiving, from a user device, a request for presentation of image content that depicts a floorplan;
- determining whether one or more criteria for providing image tiles instead of a vector image that depicts the floorplan are satisfied, each of the image tiles having the same tile size, having a file size that is smaller than a vector image file size for the vector image, and depicting a portion of the floorplan, wherein determining whether the one or more criteria for providing image tiles instead of the vector image that depicts the floorplan are satisfied comprises determining whether the image tiles are available for presentation of the floorplan or to provide the vector image that depicts the floorplan; and
- in response to determining that the one or more criteria for providing image tiles instead of the vector image that depicts the floorplan are satisfied, providing, to the user device, one or more image tiles from the image tiles to cause the user device to present the one or more image tiles on a display.

19. A system comprising one or more computers and one or more storage devices on which are stored instructions that are operable, when executed by the one or more computers, to cause the one or more computers to perform operations comprising:
- receiving, from a user device, a request for presentation of image content that depicts a floorplan;
- determining whether one or more criteria for providing image tiles instead of a vector image that depicts the floorplan are satisfied, each of the image tiles having the same tile size, having a file size that is smaller than a vector image file size for the vector image, and depicting a portion of the floorplan, wherein determining whether the one or more criteria for providing image tiles instead of the vector image that depicts the floorplan are satisfied comprises determining whether the image tiles are available for presentation of the floorplan or to provide the vector image that depicts the floorplan; and
- in response to determining that the one or more criteria for providing image tiles instead of the vector image that depicts the floorplan are satisfied, providing, to the user device, one or more image tiles from the image tiles to cause the user device to present the one or more image tiles on a display.

* * * * *